(12) United States Patent
Chang et al.

(10) Patent No.: US 11,398,442 B2
(45) Date of Patent: Jul. 26, 2022

(54) BONDING STRUCTURE, PACKAGE STRUCTURE, AND METHOD FOR MANUFACTURING PACKAGE STRUCTURE

(71) Applicant: Advanced Semiconductor Engineering, Inc., Kaohsiung (TW)

(72) Inventors: Wan Yu Chang, Kaohsiung (TW); Shao Hsuan Chuang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 17/084,496

(22) Filed: Oct. 29, 2020

(65) Prior Publication Data

US 2022/0139854 A1    May 5, 2022

(51) Int. Cl.
*H01L 23/31* (2006.01)
*H01L 23/00* (2006.01)

(52) U.S. Cl.
CPC .......... *H01L 24/08* (2013.01); *H01L 23/3171* (2013.01); *H01L 24/03* (2013.01)

(58) Field of Classification Search
CPC ......... H01L 24/08; H01L 24/09; H01L 24/03; H01L 23/3171; H01L 21/76877; H01L 24/80; H01L 24/02; H01L 24/83; H01L 24/32; H01L 24/16; H01L 23/5226; H01L 24/81; H01L 24/05
USPC ...................................................... 257/734
See application file for complete search history.

(56) References Cited

U.S. PATENT DOCUMENTS

| | | | |
|---|---|---|---|
| 2010/0255262 A1* | 10/2010 | Chen | H01L 24/80 428/172 |
| 2019/0319007 A1* | 10/2019 | Uzoh | H01L 24/09 |

\* cited by examiner

*Primary Examiner* — Didarul A Mazumder
(74) *Attorney, Agent, or Firm* — Foley & Lardner LLP

(57) ABSTRACT

A bonding structure, a package structure, and a method for manufacturing a package structure are provided. The package structure includes a first substrate, a first passivation layer, a first conductive layer, and a first conductive bonding structure. The first passivation layer is disposed on the first substrate and has an upper surface. The first passivation layer and the first substrate define a first cavity. The first conductive layer is disposed in the first cavity and has an upper surface. A portion of the upper surface of the first conductive layer is below the upper surface of the first passivation layer. The first conductive bonding structure is disposed on the first conductive layer.

16 Claims, 36 Drawing Sheets

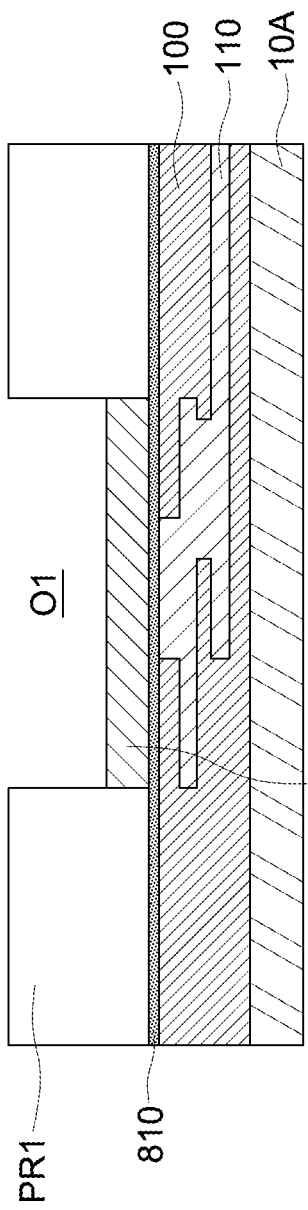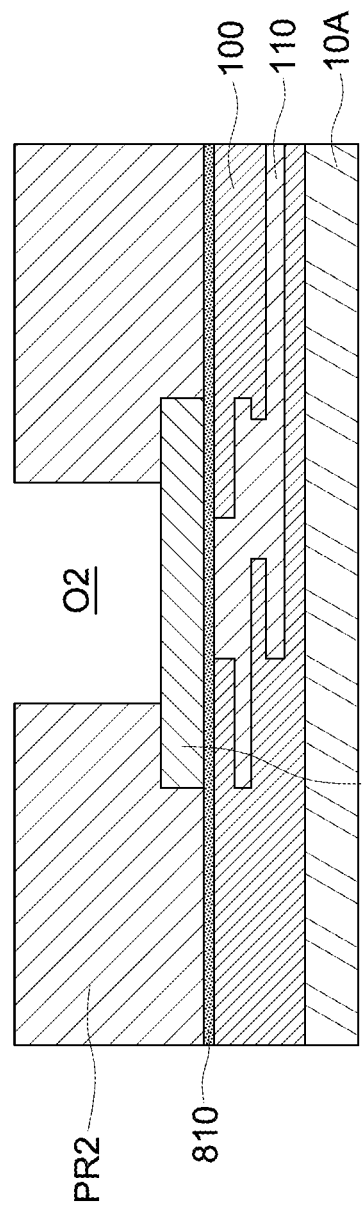

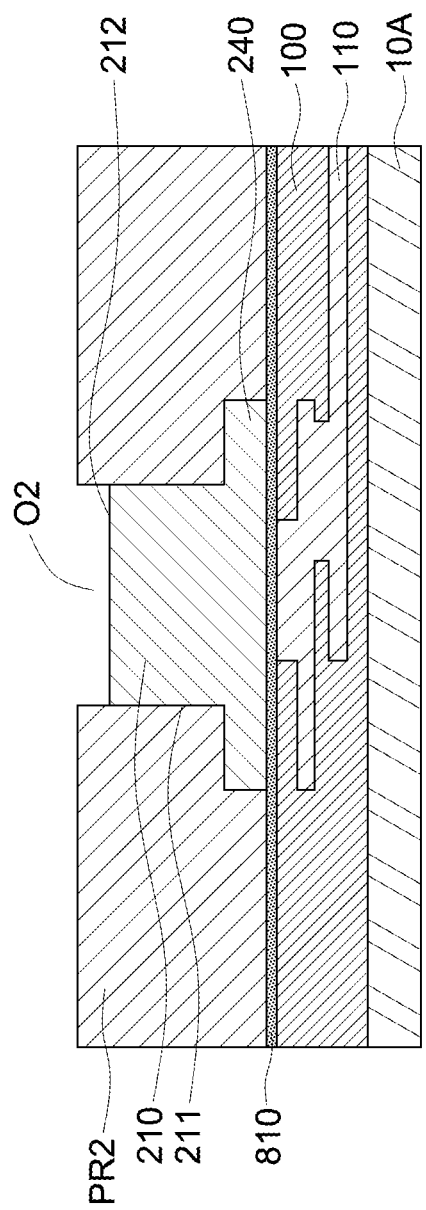
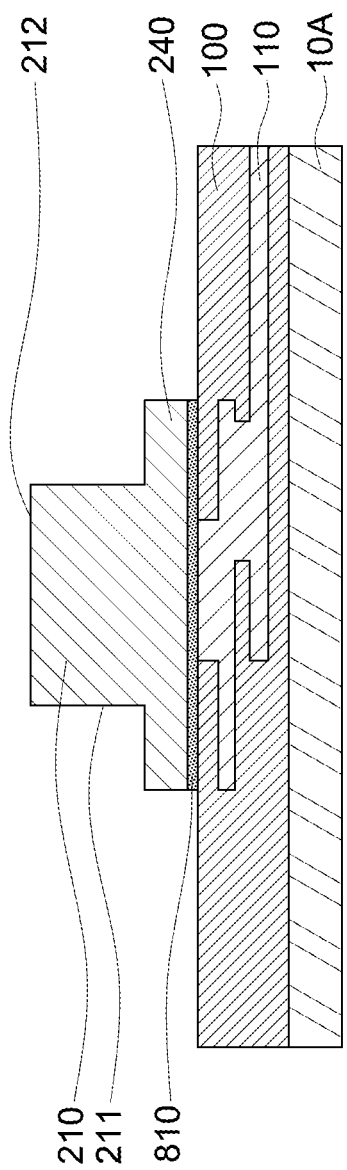
FIG. 8C
FIG. 8D

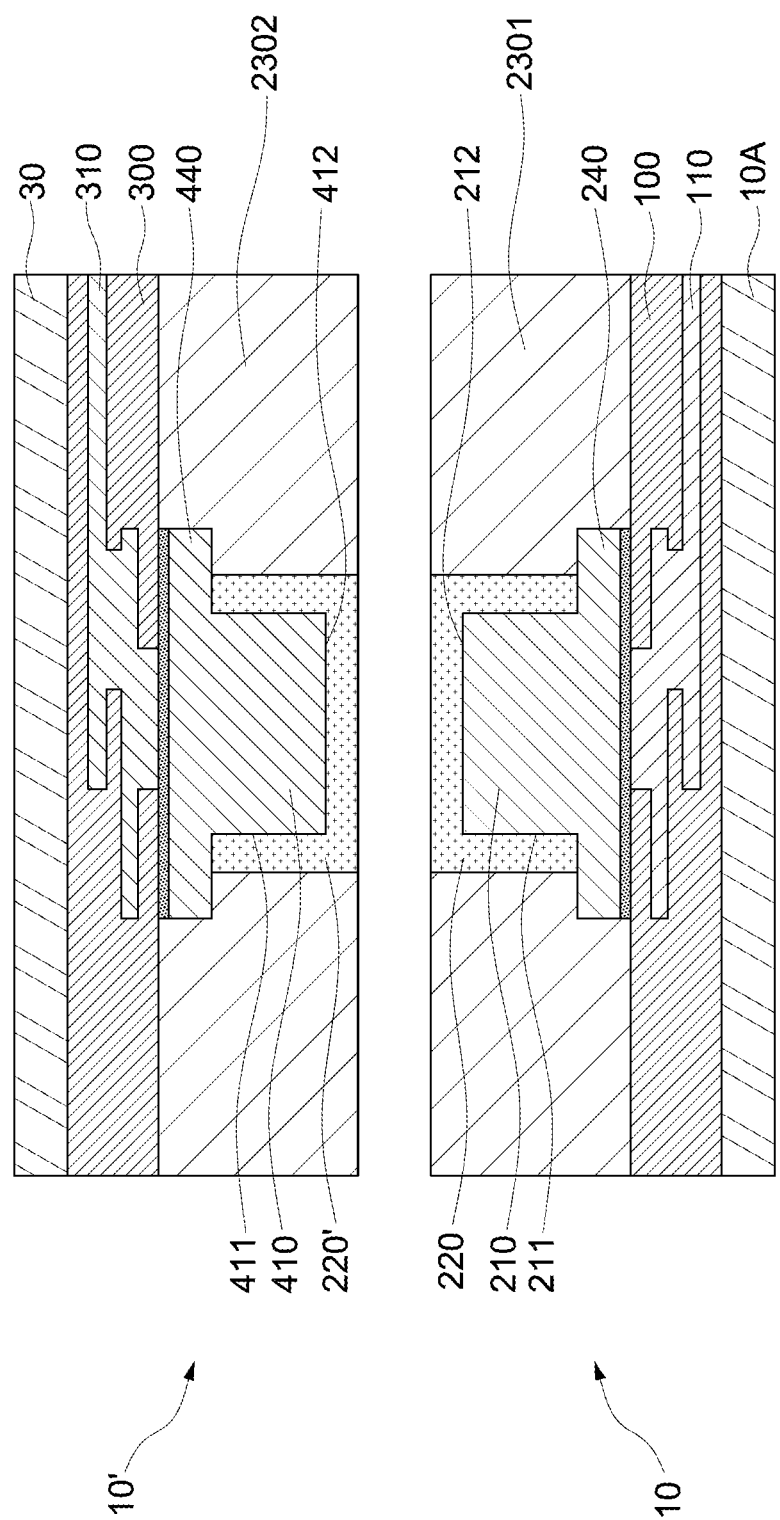

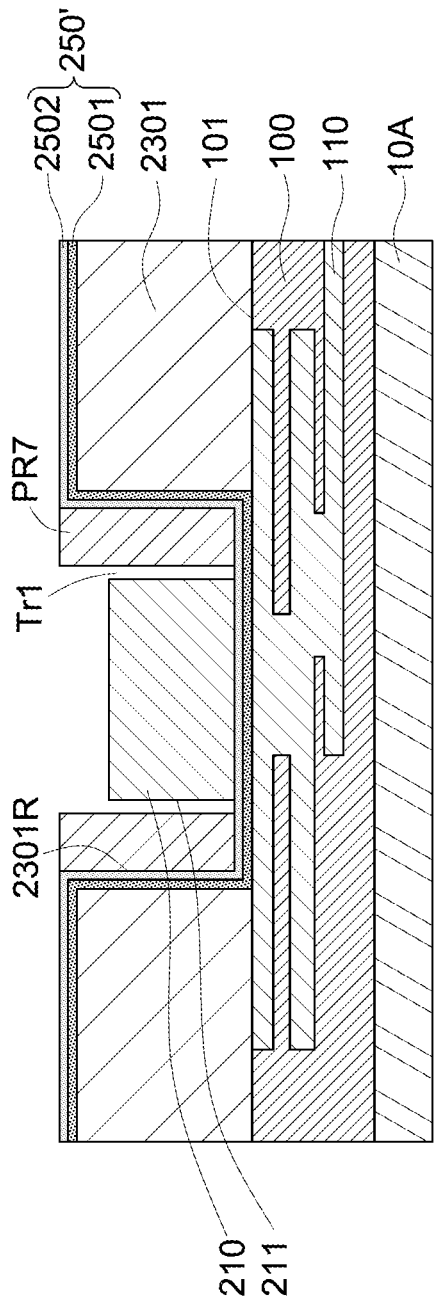
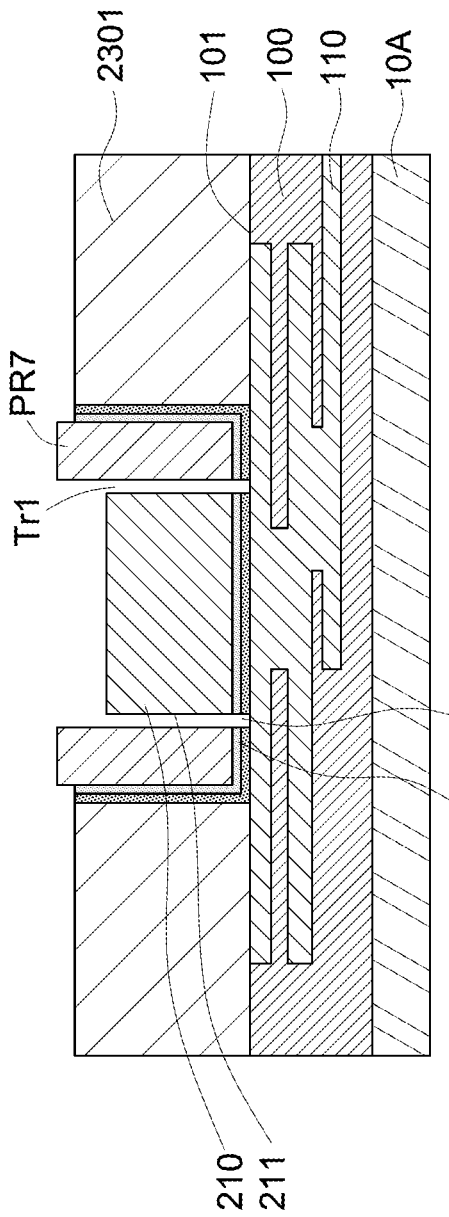
FIG. 10A
FIG. 10B

BONDING STRUCTURE, PACKAGE STRUCTURE, AND METHOD FOR MANUFACTURING PACKAGE STRUCTURE

BACKGROUND

1. Technical Field

The present disclosure relates to a bonding structure, a package structure, and a method for manufacturing a package structure.

2. Description of the Related Art

Dies may be bonded together through hybrid bonding techniques. Chemical mechanical polishing (CMP) processes are commonly performed prior to a bonding process, so as to expose conductive pad(s) and/or planarize the surface of conductive pad(s) or passivation layer. Erosion may occur on some regions of the polished surfaces, which may result in delamination. In addition, despite that conductive layers may be plated on the conductive pads to compensate the erosion portions, over-plating may easily occur on the bonding surfaces of the conductive pads, raising reliability issues for the bonding process.

SUMMARY

In one or more embodiments, a package structure includes a first substrate, a first passivation layer, a first conductive layer, and a first conductive bonding structure. The first passivation layer is disposed on the first substrate and has an upper surface. The first passivation layer and the first substrate define a first cavity. The first conductive layer is disposed in the first cavity and has an upper surface. A portion of the upper surface of the first conductive layer is below the upper surface of the first passivation layer. The first conductive bonding structure is disposed on the first conductive layer.

In one or more embodiments, a bonding structure includes a first substrate, a passivation layer, a first conductive layer, and a bonding layer. The first substrate has a first surface. The passivation layer is disposed on the first surface of the first substrate. The passivation layer and the substrate define a cavity. The first conductive layer is disposed in the cavity. The first conductive layer has an upper surface, and a portion of the upper surface is at an elevation lower than that of an upper surface of the passivation layer. The bonding layer is formed on the upper surface of the first conductive layer.

In one or more embodiments, a method for manufacturing a package structure includes the following operations: providing a bonding structure including a first substrate, a first conductive layer and a first passivation layer on the first substrate, wherein the first passivation layer and the first substrate define a first cavity, the first conductive layer is in the first cavity, and the first passivation layer and the first conductive layer define a first accommodating space; and forming a first bonding layer in the first accommodating space to cover the first conductive layer.

BRIEF DESCRIPTION OF THE DRAWINGS

Aspects of the present disclosure are best understood from the following detailed description when read with the accompanying drawings. It is noted that various features may not be drawn to scale, and the dimensions of the various features may be arbitrarily increased or reduced for clarity of discussion.

FIG. 8A, FIG. 8B, FIG. 8C, FIG. 8D, FIG. 8E, FIG. 8F, FIG. 8G, FIG. 8H and FIG. 8I illustrate various operations in a method of manufacturing a package structure in accordance with some embodiments of the present disclosure;

FIG. 10A, FIG. 10B, FIG. 10C and FIG. 10D illustrate various operations in a method of manufacturing a package structure in accordance with some embodiments of the present disclosure;

DETAILED DESCRIPTION

Figure 1:
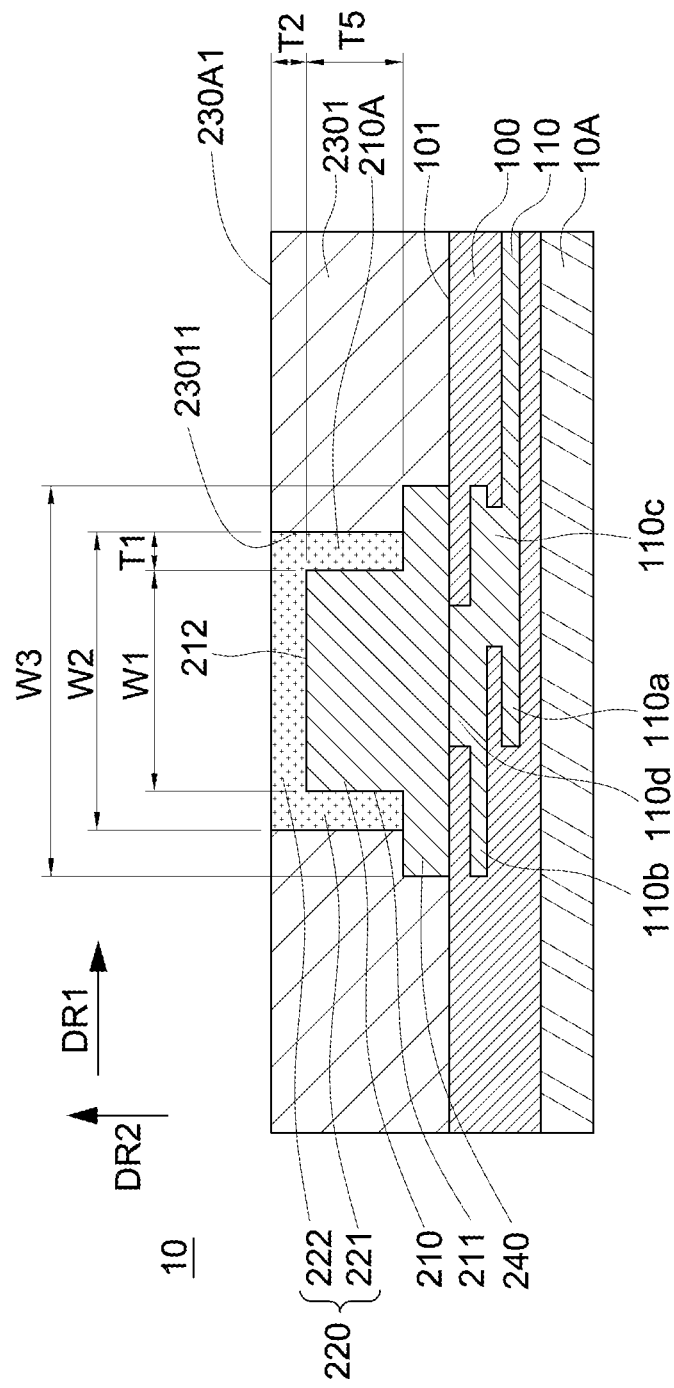
FIG. 1 illustrates a cross-sectional view of a bonding structure in accordance with some embodiments of the present disclosure.

Common reference numerals are used throughout the drawings and the detailed description to indicate the same or similar elements. The present disclosure will be more apparent from the following detailed description taken in conjunction with the accompanying drawings.

The following disclosure provides for many different embodiments, or examples, for implementing different features of the provided subject matter. Specific examples of components and arrangements are described below. These are, of course, merely examples and are not intended to be limiting. In the present disclosure, reference to the formation or disposal of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

FIG. 1 illustrates a cross-sectional view of a bonding structure 10 in accordance with some embodiments of the present disclosure. The bonding structure 10 includes a carrier 10A, a substrate 100, a conductive layer 210, a bonding layer 220 (also referred to as "a conductive bonding structure" or "the conductive connecting member"), a passivation layer 2301, and a conductive pad 240.

The carrier 10A may be or include an inorganic substrate (such as a ceramic substrate, a glass substrate or a semiconductor substrate), an organic substrate, or a metal plate. In some embodiments, the carrier 10A may serve as a temporary substrate and be removed after the bonding structure 10 is bonded to another bonding structure.

The substrate 100 is disposed on the carrier 10A. The substrate 100 has a surface 101 (also referred to as "an upper surface"). The substrate 100 may be a semiconductor substrate, for example, a wafer or a die. The semiconductor substrate may include, for example but is not limited to, silicon (Si) or other suitable semi-conductive materials. The substrate 100 may be or include an redistribution layer (RDL) structure. In some embodiments, the substrate 100 includes a redistribution layer 110 connected to the conductive pad 240. In some embodiments, the redistribution layer 110 includes a plurality of conductive traces 110a and 110b and a plurality of vias 110c and 110d. In some embodiments, the substrate 100 may further include a grounding element (not shown in drawings). In some embodiments, a first portion of the redistribution layer 110 is connected to the conductive pad 240, and a second portion of the redistribution layer 110 is exposed from e.g., a lower surface of the substrate 100, for connection to external components/devices.

The conductive layer 210 is disposed on the surface 101 of the substrate 100. In some embodiments, the conductive layer 210 has a lateral surface 211 and an upper surface 212 angled with the lateral surface 211. In some embodiments, the lateral surface 211 is connected to the upper surface 212. In some embodiments, the conductive layer 210 has a width W1. In some embodiments, the width W1 is substantially in parallel to the surface 101 of the substrate 100 along a direction DR1. In some embodiments, the width W1 may be from about 1 μm to about 120 μm (e.g., 3 μm, 10 μm, 30 μm, 50 μm or 100 μm). In some embodiments, the conductive layer 210 has a thickness T5. In some embodiments, the thickness T5 is substantially in parallel to a direction DR2 that is angled with the direction DR1. In some embodiments, the direction DR2 is substantially perpendicular to the direction DR1. In some embodiments, the thickness T5 may be from about 0.5 μm to about 250 μm (e.g., 1 μm, 5 μm, 30 μm, 80 μm, 120 μm or 200 μm). In some embodiments, the conductive layer 210 may be or include a conductive material such as a metal or metal alloy or other suitable conductive material(s). Examples include gold (Au), silver (Ag), aluminum (Al) or copper (Cu), or an alloy thereof. In some embodiments, the conductive layer 210 may be or include copper. In some embodiments, the conductive layer 210 may be a bump or a pillar.

The bonding layer 220 is formed on the conductive layer 210. In some embodiments, the bonding layer 220 is formed on the lateral surface 211 and the upper surface 212 of the conductive layer 210. In some embodiments, the bonding layer 220 directly contacts the lateral surface 211 of the conductive layer 210. In some embodiments, the bonding layer 220 directly contacts the upper surface 212 of the conductive layer 210. In some embodiments, the bonding layer 220 covers the upper surface 212 of the conductive layer 210. In some embodiments, the bonding layer 220 has a width W2. In some embodiments, the width W2 is substantially in parallel to the direction DR1. In some embodiments, the width W2 may be from about 1.2 μm to about 126 μm (e.g., 3.2 μm, 10 μm, 30 μm, 60 μm or 110 μm). In some embodiments, the bonding layer 220 may be or include a conductive material such as a metal or metal alloy or other suitable conductive material(s). Examples include gold (Au), silver (Ag), aluminum (Al), copper (Cu), nickel (Ni) or palladium (Pd) an alloy thereof. The bonding layer 220 may be a single layer or a multilayer structure. In some embodiments, the bonding layer 220 may be or include an Ag layer or have a multilayer structure, such as Ni/Au, Ni/Pd/Au or Au/Pd/Au. In some embodiments, the bonding layer 220 is free from a solder bump, a solder ball or a solder paste. In some embodiments, the bonding layer 220 is free from tin (Sn). Unlike the above mentioned metals (especially Cu), Sn has worse electron transition characteristics. In some embodiments, the conductive layer 210 and the bonding layer 220 both include Au, Ag, Al, Cu, or an alloy thereof, and the bonding layer 220 is free from Sn, such that the conductive layer 210 and the bonding layer 220 can have relatively similar electron transition characteristics, which is advantageous to the electrical performance of the bonding structure 10. In some embodiments, a material of the bonding layer 220 is different from a material of the conductive layer 210.

In some embodiments, the bonding layer 220 includes a portion 221 and a portion 222 connected to the portion 221. In some embodiments, an extending direction of the portion 221 is angled with an extending direction of the portion 222. In some embodiments, the portion 221 is substantially perpendicular to the portion 222.

In some embodiments, the portion 221 of the bonding layer 220 is on the lateral surface 211 of the conductive layer 210. In some embodiments, the portion 221 of the bonding layer 220 directly contacts the lateral surface 211 of the conductive layer 210. In some embodiments, the portion 221 of the bonding layer 220 has a thickness T1. In some embodiments, the thickness T1 is substantially in parallel to the direction DR1. In some embodiments, the thickness T1 may be from about 0.1 µm to about 3 µm (e.g., 0.3 µm, 0.5 µm, 0.8 µm, 1 µm or 2 µm).

In some embodiments, the portion 222 of the bonding layer 220 is on the upper surface 212 of the conductive layer 210. In some embodiments, the portion 222 of the bonding layer 220 directly contacts the upper surface 212 of the conductive layer 210. In some embodiments, the portion 222 of the bonding layer 220 has a thickness T2, and the thickness T2 is equal to or less than the thickness T1 of the portion 221 of the bonding layer 220. In some embodiments, the thickness T2 is substantially in parallel to the direction DR2. In some embodiments, the thickness T2 may be from about 0.1 µm to about 3 µm (e.g., 0.3 µm, 0.5 µm, 0.8 µm, 1 µm or 2 µm). In some embodiments, a ratio T1/T2 of the thickness T1 to the thickness T2 is equal to or greater than about 1.

In some embodiments, a hardness of the bonding layer 220 is equal to or lower than a hardness of the conductive layer 210. For example, the bonding layer 220 may be made of a material having a relatively low hardness (e.g., Ag and/or Au) while the conductive layer 210 may be made of a material having a relatively high hardness (e.g., Cu). The hardness of Au may range from about 2 to about 3. The hardness of Ag may range from about 2 to about 3. The hardness of Cu may be about 3. Accordingly, a relatively soft bonding layer 220 is formed and more flexible to the pressure applied for bonding the bonding structure 10 to another bonding structure, such that the tolerance of volume change of the bonding layer 220 may be increased (e.g., the bonding layer 220 may be compressed after bonding.) In some embodiments, the bonding layer 220 may be formed to be slightly protruded from an upper surface of the passivation layer 2301) so that it can fill into vacancies or voids that may be found at an interface of the two bonding structures, thereby reducing the amount or volume of undesired vacancies or voids and improving the reliability of the resulting structure.

In some embodiments, a melting point of the bonding layer 220 is lower than a melting point of the conductive layer 210. For example, the bonding layer 220 may be made of a material having a relatively low melting point (e.g., Ag and/or Au) while the conductive layer 210 may be made of a material having a relatively high melting point (e.g., Cu). The melting point of Au may be about 1337 K. The melting point of Ag may be about 1234 K. The melting point of Cu may be about 1358 K. Accordingly, a lower operation temperature can be used for bonding the bonding structure 10 to another bonding structure, and thus the components in the bonding structure 10 and another bonding structure can be prevented from being damaged by a high-temperature bonding process.

The passivation layer 2301 is disposed on the substrate 100. In some embodiments, the passivation layer 2301 has an upper surface 230A1. In some embodiments, the passivation layer 2301 and the substrate 100 define a cavity, and the conductive layer 210 is in the cavity. In some embodiments, an upper surface of the bonding layer 220 is substantially coplanar with or protruded from the upper surface 230A1 of the passivation layer 2301. In some embodiments, an upper surface of the bonding layer 220 is at an elevation substantially the same as or higher than the upper surface 230A1 of the passivation layer 2301. In some embodiments, at least a portion of the upper surface 212 of the conductive layer 210 is below the upper surface 230A1 of the passivation layer 2301. In some embodiments, the upper surface 212 of the conductive layer 210 is at an elevation lower than that of the upper surface 230A1 of the passivation layer 2301. In some embodiments, the passivation layer 2301 and the lateral surface 211 of the conductive layer 210 define a trench 210A (also referred to as "an accommodating space") for accommodating a portion of the bonding layer 220. In some embodiments, the trench 210A is defined by the lateral surface 211 of the conductive layer 210 and an inner lateral surface 23011 of the passivation layer 2301, and the bonding layer 220 is in the trench 210A. In some embodiments, the trench 210A has a width (i.e., the thickness T1). In some embodiments, the portion 221 of the bonding layer 220 is in the trench 210A. In some embodiments, the portion 221 of the bonding layer 220 directly contacts the passivation layer 2301. In some embodiments, the portion 222 of the bonding layer 220 directly contacts the passivation layer 2301. In some embodiments, the conductive layer 210 is spaced apart form the passivation layer 2301 by the portion 221 of the bonding layer 220. In some embodiments, the passivation layer 2301 includes silicon oxide, silicon nitride, gallium oxide, aluminum oxide, scandium oxide, zirconium oxide, lanthanum oxide, hafnium oxide, or a combination thereof.

The conductive pad 240 may be disposed on the substrate 100. The conductive pad 240 may be embedded in the substrate 100 and exposed from the upper surface 101 of the substrate 100. In some embodiments, the conductive pad 240 is disposed between the bonding layer 220 and the substrate 100. In some embodiments, the redistribution layer 110 of the substrate 100 is electrically connected to the conductive layer 210 through the conductive pad 240. In some embodiments, the conductive pad 240 has a width W3. In some embodiments, the width W3 is substantially in parallel to the direction DR1. In some embodiments, the width W3 may satisfy the following expression: W1≤W3≤3×W1. In some embodiments, the conductive pad 240 may be or include a conductive material such as a metal or metal alloy or other suitable conductive material(s). Examples include gold (Au), silver (Ag), aluminum (Al) or copper (Cu), or an alloy thereof. In some embodiments, the conductive pad 240 may be or include copper.

Figure 1A:
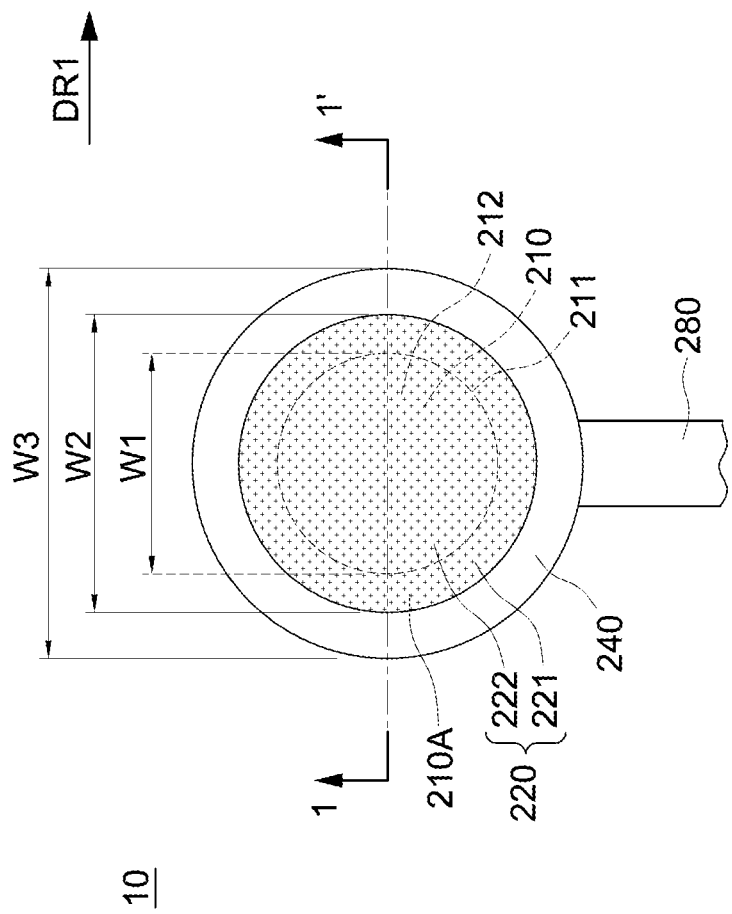
FIG. 1A illustrates a top view of a bonding structure in accordance with some embodiments of the present disclosure.

FIG. 1A illustrates a top view of a bonding structure 10 in accordance with some embodiments of the present disclosure. In some embodiments, FIG. 1 illustrates a cross-sectional view along the cross-sectional line 1-1' in FIG. 1A. It should be noted that some components (e.g., the substrate 100) are omitted in FIG. 1A for clarity.

In some embodiments, the bonding layer 220 surrounds the lateral surface 211 of the conductive layer 210. In some embodiments, the portion 221 of the bonding layer 220 surrounds the lateral surface 211 of the conductive layer 210. In some embodiments, the portion 222 of the bonding layer 220 fully covers the surface 212 of the conductive layer 210. In some embodiments, a peripheral region of the conductive pad 240 is exposed from and surrounds the bonding layer 220 from a top view perspective. As illustrated in FIG. 1A, the conductive pad 240 may be electrically connected a conductive trace 280 disposed on the substrate 100.

Figure 1B:
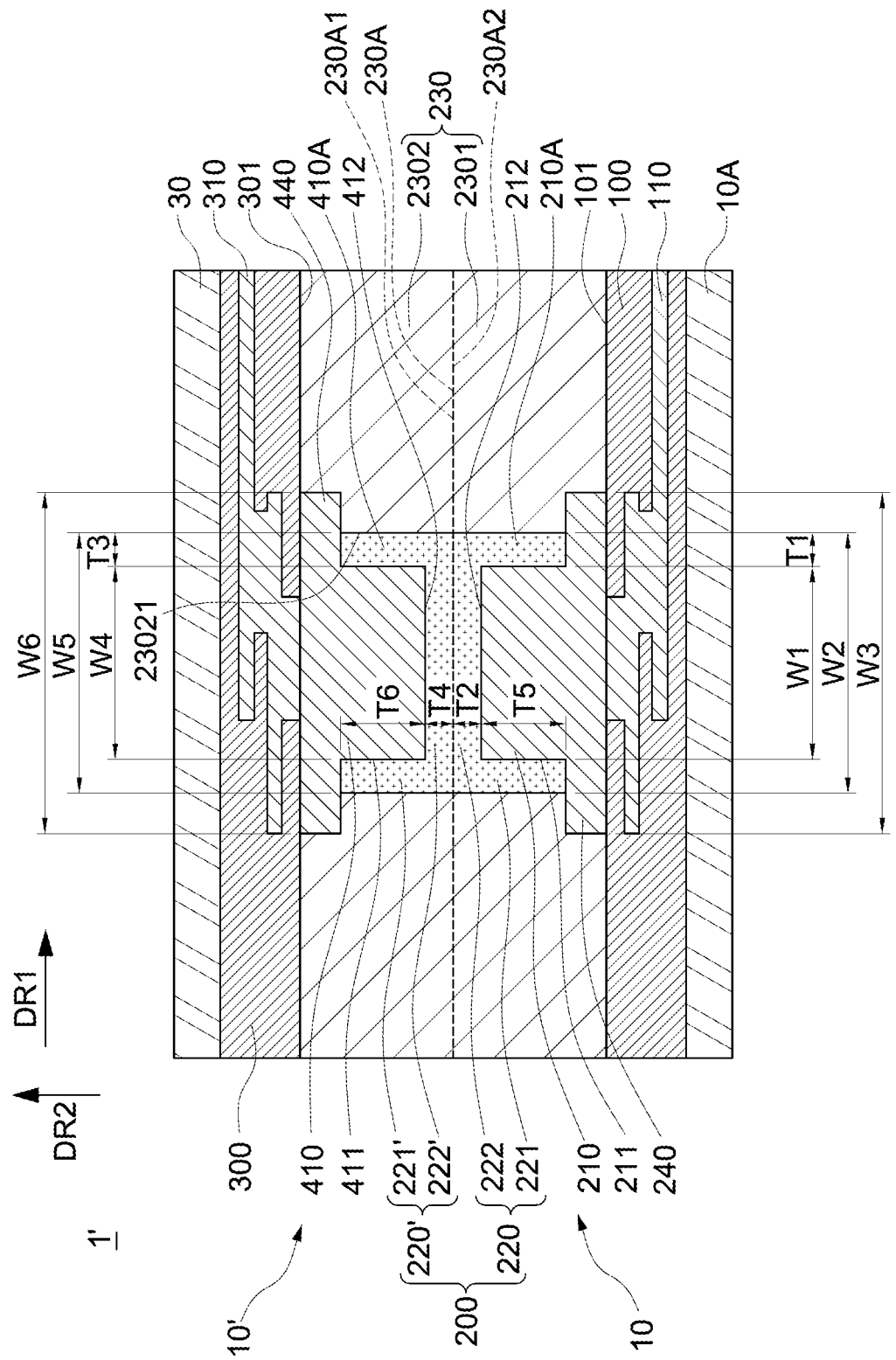
FIG. 1B illustrates a cross-sectional view of a package structure in accordance with some embodiments of the present disclosure.

FIG. 1B illustrates a cross-sectional view of a package structure 1 in accordance with some embodiments of the present disclosure. The package structure 1 includes carriers 10A and 30, substrates 100 and 300, conductive layers 210 and 410, a bonding structure 200 (also referred to as "a conductive bonding structure" or "a conductive connecting member"), a passivation structure 230, and conductive pads 240 and 440. In some embodiments, the package structure 1 includes bonding structures 10 and 10' bonded to each other, and the details will be discussed hereinafter.

In some embodiments, the carrier 30 is similar to the carrier 10A as aforementioned, and the description thereof is omitted hereinafter.

The substrate 300 is disposed on the carrier 30. The substrate 300 has a surface 301 (also referred to as "an upper surface"). The substrate 300 may be a semiconductor substrate, for example, a wafer or a die. The semiconductor substrate may include, for example but is not limited to, silicon (Si) or other suitable semi-conductive materials. The substrate 100 may be or include an redistribution layer (RDL) structure. In some embodiments, the substrate 300 includes a redistribution layer 310 connected to the conductive pad 440. In some embodiments, the redistribution layer 310 includes a plurality of conductive traces and a plurality of vias.

In some embodiments, the conductive layer 210 is disposed on the substrate 100, and the upper surface 212 of the conductive layer 210 is facing the substrate 300. In some embodiments, the description of the conductive layer 210 is as aforementioned and is omitted hereinafter.

The conductive layer 410 is disposed on the substrate 300. In some embodiments, the conductive layer 410 is disposed on the surface 301 of the substrate 300. In some embodiments, the conductive layer 410 has a lower surface 412 facing the substrate 100 and a lateral surface 411 angled with the lower surface 412. In some embodiments, the lateral surface 411 is connected to the lower surface 412. In some embodiments, at least a portion of the lower surface 412 of the conductive layer 410 is below the bonding interface 230A.

In some embodiments, the conductive layer 410 has a width W4. In some embodiments, the width W4 is substantially in parallel to the direction DR1. In some embodiments, the width W4 may be from about 1 μm to about 120 μm (e.g., 3 μm, 10 μm, 30 μm, 50 μm or 100 μm). In some embodiments, the width W4 of the conductive layer 410 may be substantially the same as or different from the width W1 of the conductive layer 210. In some embodiments, the conductive layer 410 has a thickness T6. In some embodiments, the thickness T6 is substantially in parallel to the direction DR2. In some embodiments, the thickness T6 may be from about 0.5 μm to about 250 μm (e.g., 1 μm, 5 μm, 30 μm, 80 μm, 120 μm or 200 μm). In some embodiments, the thickness T6 of the conductive layer 410 may be substantially the same as or different from the thickness T5 of the conductive layer 210. In some embodiments, the conductive layer 410 may be or include a conductive material such as a metal or metal alloy or other suitable conductive material(s). Examples include gold (Au), silver (Ag), aluminum (Al) or copper (Cu), or an alloy thereof. In some embodiments, the conductive layer 410 may be or include copper. In some embodiments, the conductive layer 210 may be a bump or a pillar.

The bonding structure 200 connects the conductive layer 210 and the conductive layer 410. In some embodiments, the bonding structure 200 includes bonding layers 220 and 220' (also referred to as "conductive bonding structures"). In some embodiments, the bonding layer 220' is disposed on the conductive layer 410 and contacting the bonding layer 220 to form the bonding structure 200. In some embodiments, the bonding layer 220 is on the lateral surface 211 of the conductive layer 210, and the bonding layer 220' is on the lateral surface 411 of the conductive layer 410. In some embodiments, the bonding layer 220 directly contacts the lateral surface 211 of the conductive layer 210, and the bonding layer 220' directly contacts the lateral surface 411 of the conductive layer 410. In some embodiments, the bonding layer 220 surrounds the lateral surface 211 of the conductive layer 210, and the bonding layer 220' surrounds the lateral surface 411 of the conductive layer 410. In some embodiments, the description of the bonding layer 220 is as aforementioned and is omitted hereinafter.

In some embodiments, the bonding layer 220' directly contacts the lateral surface 411 and the lower surface 412 of the conductive layer 410. In some embodiments, the bonding layer 220' has a width W5. In some embodiments, the width W5 is substantially in parallel to the direction DR1. In some embodiments, the width W5 may be from about 1.2 μm to about 126 μm (e.g., 3.2 μm, 10 μm, 30 μm, 60 μm or 110 μm). In some embodiments, the width W5 of the bonding layer 220' may be substantially the same as or different from the width W2 of the bonding layer 220. In some embodiments, the bonding layer 220' may be or include a conductive material such as a metal or metal alloy or other suitable conductive material(s). Examples include gold (Au), silver (Ag), aluminum (Al), copper (Cu), nickel (Ni) or palladium (Pd) an alloy thereof. The bonding layer 220' may be a single layer or a multilayer structure. In some embodiments, the bonding layer 220' may be or include an Ag layer or have a multilayer structure, such as Ni/Au, Ni/Pd/Au or Au/Pd/Au. In some embodiments, the bonding layer 220' is free from a solder bump, a solder ball or a solder paste. In some embodiments, the bonding layer 220' is free from tin (Sn). In some embodiments, a material of the bonding layer 220' is different from a material of the conductive layer 410.

In some embodiments, the bonding layer 220' includes portions 221' and 222'. In some embodiments, an extending direction of the portion 221' is angled with an extending direction of the portion 222'. In some embodiments, the portion 221' is substantially perpendicular to the portion 222'.

In some embodiments, the portion 221' of the bonding layer 220' is on the lateral surface 411 of the conductive layer 410. In some embodiments, the portion 221' directly contacts the lateral surface 411 of the conductive layer 410. In some embodiments, the portion 221' of the bonding layer 220' has a thickness T3. In some embodiments, the thickness T3 is substantially in parallel to the direction DR1. In some embodiments, the thickness T3 may be from about 0.1 μm to about 3 μm (e.g., 0.3 μm, 0.5 μm, 0.8 μm, 1 μm or 2 μm).

In some embodiments, the portion 222' of the bonding layer 220' is on the lower surface 412 of the conductive layer 410. In some embodiments, the portion 222' of the bonding layer 220' directly contacts the lower surface 412 of the conductive layer 410. In some embodiments, the portion 222' of the bonding layer 220' has a thickness T4, and the thickness T4 is equal to or less than the thickness T3 of the portion 221' of the bonding layer 220'. In some embodiments, the thickness T4 is substantially in parallel to the direction DR2. In some embodiments, the thickness T4 may be from about 0.1 μm to about 3 μm (e.g., 0.3 μm, 0.5 μm, 0.8 μm, 1 μm or 2 μm). In some embodiments, a ratio T3/T4 of the thickness T3 to the thickness T4 is equal to or greater than 1. In some embodiments, the bonding layer 220 and the bonding layer 220' may be formed integrally and free from a bonding interface between the bonding layer 220 and the bonding layer 220', In some embodiments, a width (i.e., the thickness T1) of the trench 210A or a width (i.e., the thickness T3) of the trench 410A is less than a distance (i.e., the sum of the thicknesses T2 and T4) between the upper surface 212 of the conductive layer 210 and the lower surface 412 of the conductive layer 410.

In some embodiments, the thickness T1 of the portion 221 of the bonding layer 220 may be substantially equal to or different from the thickness T3 of the portion 221' of the bonding layer 220'. In some embodiments, a ratio T1/T3 of the thickness T1 of the portion 221 of the bonding layer 220 to the thickness T3 of the portion 221' of the bonding layer 220' is equal to about 1. In some other embodiments, the ratio T1/T3 of the thickness T1 of the portion 221 of the bonding layer 220 to the thickness T3 of the portion 221' of the bonding layer 220' may be greater than or less than about 1. In some embodiments, the thickness T2 of the portion 222 of the bonding layer 220 may be substantially equal to or different from the thickness T4 of the portion 222' of the bonding layer 220'. In some embodiments, a ratio T2/T4 of the thickness T2 of the portion 222 of the bonding layer 220 to the thickness T4 of the portion 222' of the bonding layer 220' is equal to about 1. In some other embodiments, the ratio T2/T4 of the thickness T2 of the portion 222 of the bonding layer 220 to the thickness T4 of the portion 222' of the bonding layer 220' may be greater than or less than about 1.

In some embodiments, a material of the bonding structure 200 is different from a material of the conductive layer 210. In some embodiments, a material of the bonding structure 200 is different from a material of the conductive layer 410. In some embodiments, a material of the bonding layer 220' is different from a material of the conductive layer 210. In some embodiments, a material of the bonding layer 220' is different from a material of the conductive layer 410.

In some embodiments, a melting point of the bonding structure 200 is lower than a melting point of the conductive layer 210 and a melting point of the conductive layer 410. In some embodiments, a melting point of the bonding layer 220' is lower than a melting point of the conductive layer 410. In some embodiments, the bonding structure 200 may be made of a material having a relatively low melting point (e.g., Ag) while the conductive layers 210 and 410 may be made of a material having a relatively high melting point (e.g., Cu). Accordingly, a lower operation temperature can be used for bonding the bonding layer 220' to the bonding layer 220, and thus the components in the bonding structure 10' and the bonding structure 10 can be prevented from being damaged by a high-temperature bonding process In some embodiments, a hardness of the bonding structure 200 is equal to or lower than a hardness of the conductive layer 210 and a hardness of the conductive layer 410. In some embodiments, a hardness of the bonding layer 220' is equal to or lower than a hardness of the conductive layer 410. In some embodiments, the bonding structure 200 may be made of a material having a relatively low hardness (e.g., Ag) while the conductive layer 210 and the conductive layer 410 may be made of a material having a relatively high hardness (e.g., Cu). Accordingly, relatively soft bonding layers 220 and 220' are formed and more flexible to the pressure applied for bonding the bonding structure 10' to the bonding structure 10, such that the tolerance of volume change of the bonding layers 220 and 220' may be increased (e.g., the bonding layers 220 and 220' may be compressed after bonding). In some embodiments, similar to the bonding layer 220, the bonding layer 220' may be formed to be slightly protruded from an upper surface of a passivation layer 2302 so that it can fill into vacancies or voids that may be found at an interface of the bonding layers 220 and 220', thereby reducing the amount or volume of undesired vacancies or voids and improving the reliability of the resulting structure.

In some embodiments, the passivation structure 230 is disposed between the substrate 100 and the substrate 300. In some embodiments, the passivation structure 230 surrounds the bonding structure 200. In some embodiments, the passivation structure 230 surrounds the conductive pads 240 and 440.

In some embodiments, the passivation structure 230 includes passivation layers 2301 and 2302. In some embodiments, the passivation layer 2301 is connected to the passivation layer 2302. In some embodiments, a lower surface 230A2 of the passivation layer 2302 is bonded to the upper surface 230A1 of the passivation layer 2301 to form a bonding interface 230A. In some embodiments, the description of the passivation layer 2301 is as aforementioned and is omitted hereinafter.

In some embodiments, the passivation layer 2302 is disposed on the substrate 300. In some embodiments, the passivation layer 2302 and the substrate 300 define a cavity, and the conductive layer 410 is in the cavity and electrically connected to the bonding layer 210. In some embodiments, the passivation layer 2302 and the lateral surface 411 of the conductive layer 410 define a trench 410A (also referred to as "an accommodating space"). In some embodiments, the trench 410A is defined by the lateral surface 411 of the conductive layer 410 and an inner lateral surface 23021 of the passivation layer 2302, and the bonding layer 220' is in the trench 410A. In some embodiments, the trench 410A has a width (i.e., the thickness T3). In some embodiments, the portion 221' of the bonding layer 220' is in the trench 410A. In some embodiments, the portion 221' of the bonding layer 220' directly contacts the passivation layer 2302. In some embodiments, the portion 222' of the bonding layer 220' directly contacts the passivation layer 2302. In some embodiments, the passivation layer 2302 is spaced apart from the lateral surface 411 of the conductive layer 410 by the bonding layer 220'. In some embodiments, the passivation layer 2302 includes silicon oxide, silicon nitride, gallium oxide, aluminum oxide, scandium oxide, zirconium oxide, lanthanum oxide, hafnium oxide, or a combination thereof. In some embodiments, a material of the passivation layer 2301 may be the same as or different from a material of the passivation layer 2302.

The conductive pad 440 may be disposed on the substrate 300. The conductive pad 440 may be embedded in the substrate 300 and exposed from the upper surface 301 of the substrate 400. In some embodiments, the conductive pad 440 is disposed between the bonding layer 220' and the substrate 300. In some embodiments, the redistribution layer 310 of the substrate 300 is electrically connected to the conductive layer 410 through the conductive pad 440. In some embodiments, the conductive pad 440 has a width W6. In some embodiments, the width W6 is substantially in parallel to the direction DR1. In some embodiments, the width W6 may satisfy the following expression: W4≤W6≤3×W4. In some embodiments, the width W6 of the conductive pad 440 may be substantially the same as or different from the width W3 of the conductive pad 240. In some embodiments, the conductive pad 440 may be or include a conductive material such as a metal or metal alloy or other suitable conductive material(s). Examples include gold (Au), silver (Ag), aluminum (Al) or copper (Cu), or an alloy thereof. In some embodiments, the conductive pad 440 may be or include copper.

In some embodiments, the bonding structure 10 includes the conductive layer 210, the bonding layer 220, the passivation layer 2301, and the conductive pad 240, and the bonding structure 10' includes the conductive layer 410, the bonding layer 220', the passivation layer 2302, and the conductive pad 440. In some embodiments, the bonding structure 10 is bonded to the bonding structure 10' through the bonding structure 200 and the passivation structure 230.

Figure 1C:
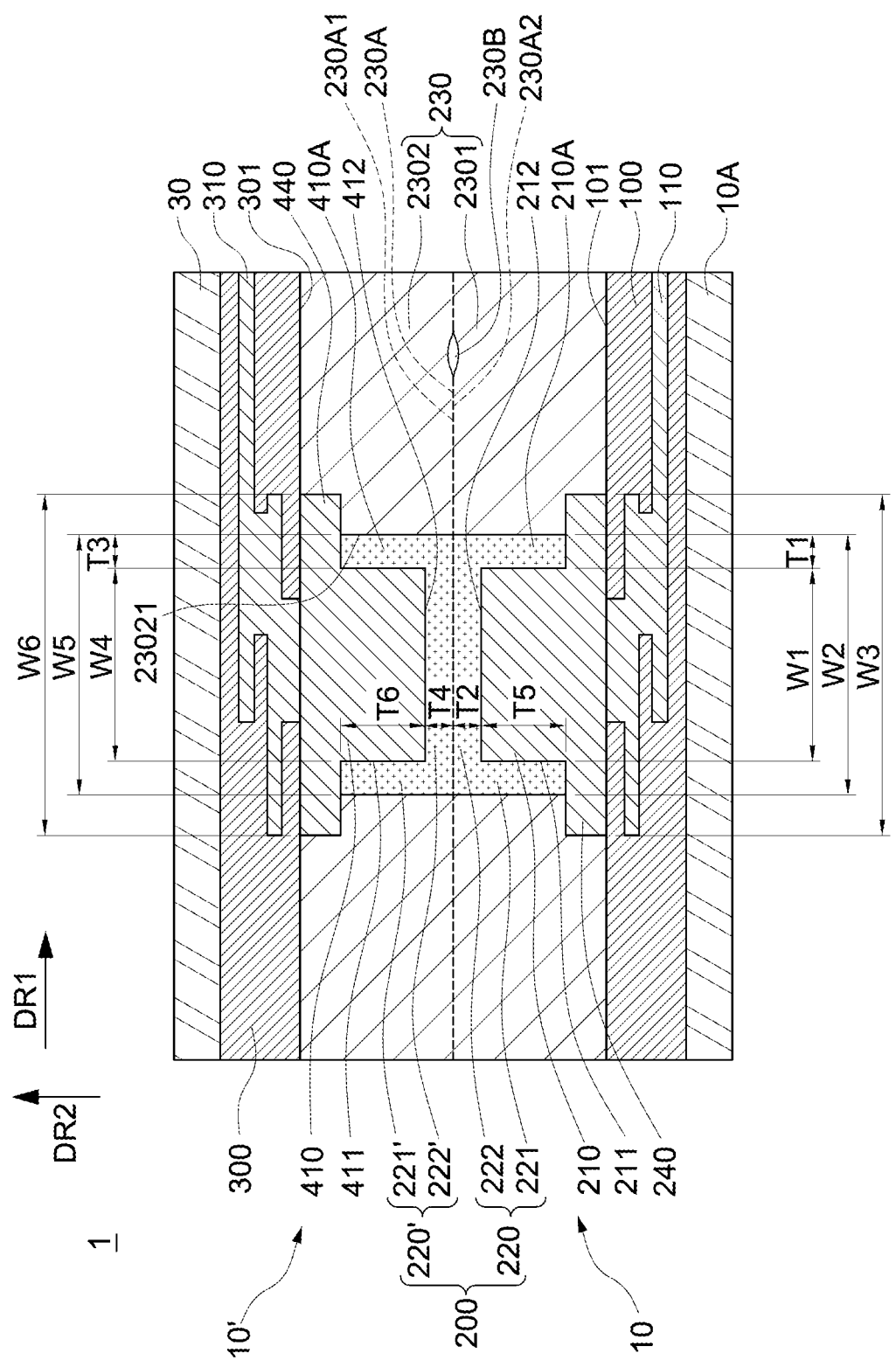
FIG. 1C illustrates a cross-sectional view of a package structure in accordance with some embodiments of the present disclosure.

FIG. 1C illustrates a cross-sectional view of a package structure 1' in accordance with some embodiments of the present disclosure. The package structure1'2 is similar to the package structure 1 in FIG. 1B except that, for example, the package structure 1' includes void(s) 230B at the bonding interface 230A between the passivation layers 2301 and 2302.

Figure 2:
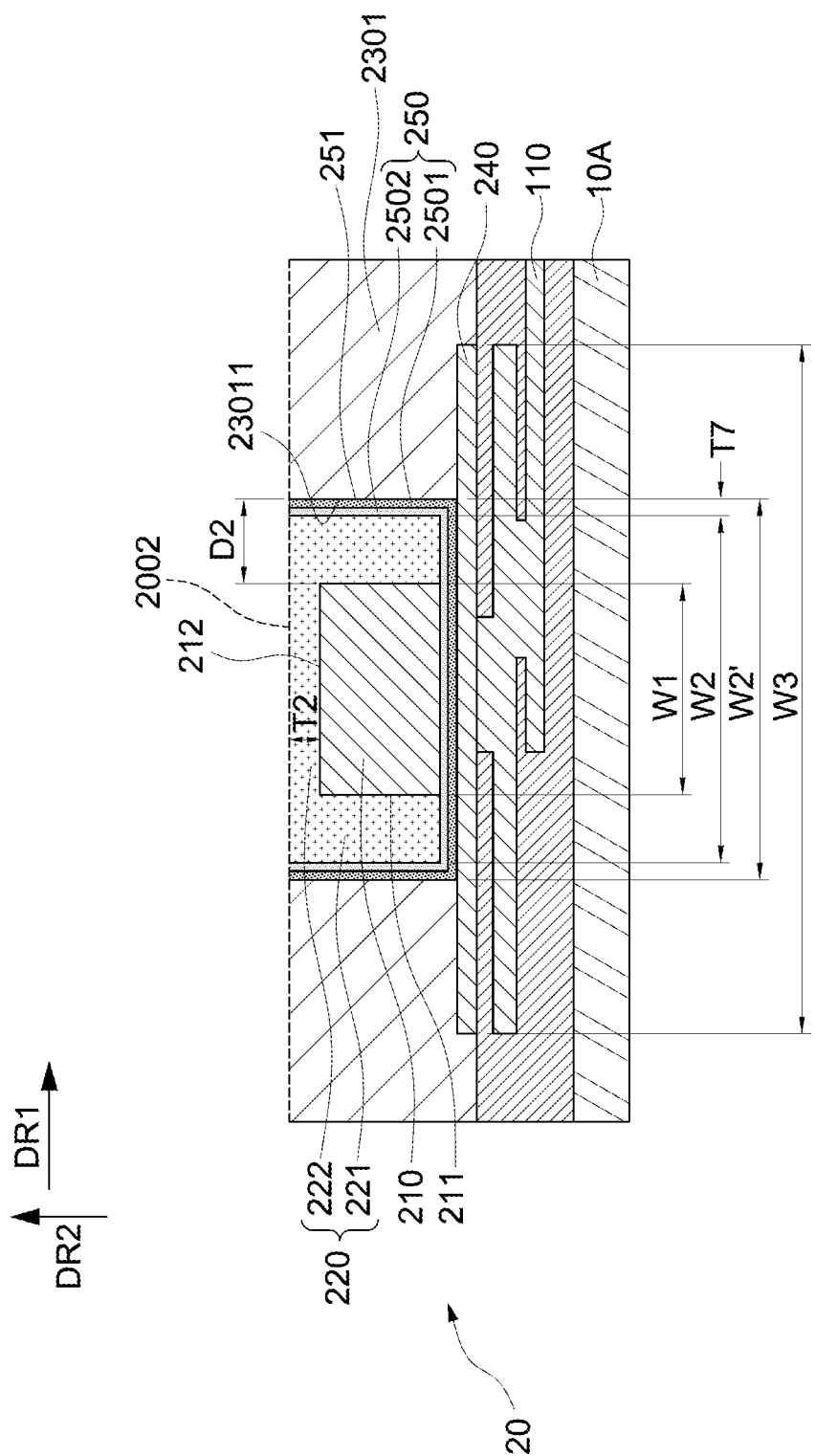
FIG. 2 illustrates a cross-sectional view of a bonding structure in accordance with some embodiments of the present disclosure.
Figure 2A:
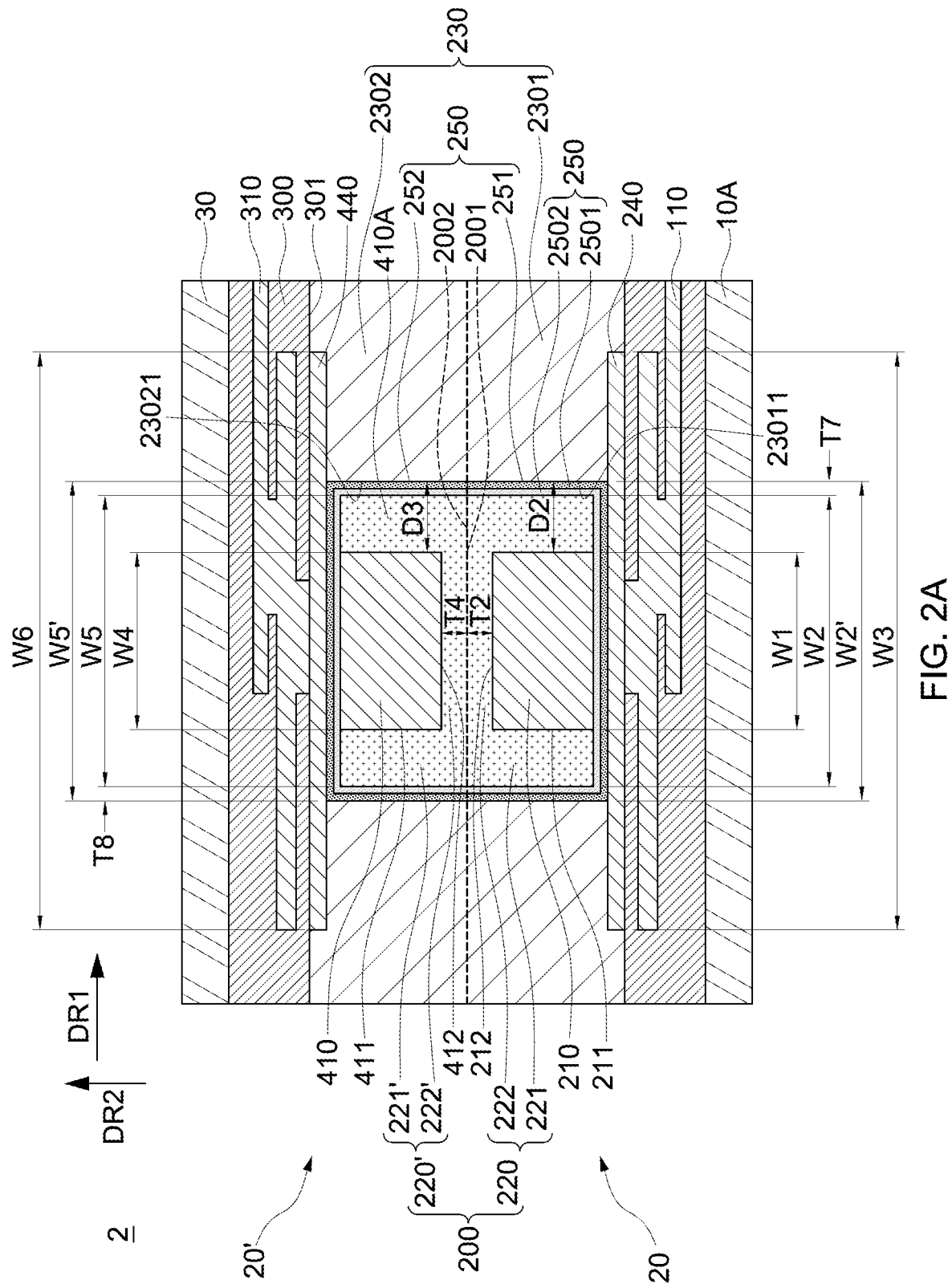
FIG. 2A illustrates a cross-sectional view of a package structure in accordance with some embodiments of the present disclosure.

FIG. 2 illustrates a cross-sectional view of a bonding structure 20 in accordance with some embodiments of the present disclosure, and FIG. 2A illustrates a cross-sectional view of a package structure 2 in accordance with some embodiments of the present disclosure. The bonding structure 20 is similar to the bonding structure 10 in FIG. 1 except that, for example, the bonding structure 20 includes a seed layer 250. The package structure 2 is similar to the package structure 1 in FIG. 1B except that, for example, the package structure 2 includes bonding structures 20 and 20' having structures different from that of the bonding structures 10 and 10'.

In some embodiments, the bonding structure 20 further includes a seed layer 250 (or a portion 251 of a seed layer 250). In some embodiments, the bonding structure 20' further includes a seed layer 250 (or a portion 252 of a seed layer 250). In some embodiments, the seed layer 250 is on the inner lateral surface 23011 of the passivation layer 2301. In some embodiments, the seed layer 250 is on the inner lateral surface 23021 of the passivation layer 2302. In some embodiments, a distance D2 between the seed layer 250 and the lateral surface 211 of the conductive layer 210 or a distance D3 between the seed layer 250 and the lateral surface 411 of the conductive layer 410 is greater than a distance (i.e., the sum of the thicknesses T2 and T4) between the upper surface 212 of the conductive layer 210 and the lower surface 412 of the conductive layer 410. In some embodiments, the seed layer 250 is disposed between the bonding structure 200 and the passivation structure 230. In some embodiments, the bonding layers 220 and 220' are spaced apart from the passivation structure 230 by the seed layer 250. In some embodiments, the bonding layers 220 and 220' are spaced apart from the substrates 100 and 300 by the seed layer 250. Due to the presence of the seed layer 250, the bonding layer 220 can be grown not only from the surfaces of the conductive layer 210 but also from the lateral surface 2311 of the passivation layer 2301 with the aid of passivation layer, and thus the plating rate can be significantly increased. Therefore, the formation rate of the bonding layer 220 is increased, and the manufacturing time of the bonding structure 20 is reduced.

In some embodiments, the seed layer 250 surrounds the bonding layer 220 on the lateral surface 211 of the conductive layer 210. In some embodiments, the seed layer 250 surrounds the bonding layer 220' on the lateral surface 411 of the conductive layer 410. In some embodiments, the seed layer 250 may include, for example, titanium (Ti), copper (Cu), nickel (Ni), another metal, or an alloy (such as a titanium-tungsten alloy (TiW)). In some embodiments, the seed layer 250 includes a sub-layer 2501 and a sub-layer 2502 on the sub-layer 2501. In some embodiments, the sub-layer 2501 surrounds the sub-layer 2502. In some embodiments, the sub-layer 2501 is a Ti layer, and the sub-layer 2502 is a Cu layer.

In some embodiments, the seed layer 250 includes a portion 251 and a portion 252. In some embodiments, the portion 251 is connected to the portion 252. In some embodiments, the portion 251 is on the inner lateral surface 23011 of the passivation layer 2301. In some embodiments, the portion 251 surrounds the lateral surface 211 of the conductive layer 210. In some embodiments, the portion 252 surrounds the lateral surface 411 of the conductive layer 410. In some embodiments, the portion 252 is on the inner lateral surface 23021 of the passivation layer 2302.

In some embodiments, the portion 251 of the seed layer 250 has a thickness T7. In some embodiments, the thickness T7 is substantially in parallel to the direction DR1. In some embodiments, the thickness T7 may be from about 0.1 µm to about 2 µm (e.g., 0.3 µm, 0.5 µm, 0.8 µm, 1 µm or 1.8 µm). In some embodiments, the portion 252 of the seed layer 250 has a thickness T8. In some embodiments, the thickness T8 is substantially in parallel to the direction DR1. In some embodiments, the thickness T8 may be from about 0.1 µm to about 2 µm (e.g., 0.3 µm, 0.5 µm, 0.8 µm, 1 µm or 1.8 µm). In some embodiments, the thickness T7 of the portion 251 of the seed layer 250 may be the same as or different from the thickness T8 of the portion 252 of the seed layer 250.

In some embodiments, the bonding structure 20 includes the conductive layer 210, the bonding layer 220, the passivation layer 2301, the conductive pad 240, and the portion 251 of the seed layer 250, and the bonding structure 20' includes the conductive layer 410, the bonding layer 220', the passivation layer 2302, the conductive pad 440, and the portion 252 of the seed layer 50. In some embodiments, the bonding structure 20 is bonded to the bonding structure 20' through the bonding structure 200 and the passivation structure 230. In some embodiments, the bonding structure 200 includes two portions bonded to each other, the two portions respectively including the bonding layer 220, the bonding layer 220 and the portion 251 of the seed layer 250, and the bonding layer 410, the bonding layer 220' and the portion 252 of the seed layer 250. The two portions of the bonding structure 200 may have bonding surfaces 2001 and 2002 that are bonded to each other.

In some embodiments, a width W2' (i.e., a sum of two times the thickness T7 and the width W2) of the bonding surface 2001 may be from about 1.6 µm to about 128 µm (e.g., 3.2 µm, 12 µm, 40 µm, 70 µm or 120 µm). In some embodiments, a width W5' (i.e., a sum of two times the thickness T8 and the width W5) of the bonding surface 2002 may be from about 1.6 µm to about 128 µm (e.g., 3.2 µm, 12 µm, 40 µm, 70 µm or 120 µm). In some embodiments, the width W5' of the bonding surface 2002 may be substantially the same as or different from the width W2' of the bonding surface 2001. In some embodiments, the width W3 may satisfy the following expression: W1≤W3≤5×W1. In some embodiments, the width W6 may satisfy the following expression: W4≤W6≤5×W4. In some embodiments, the width W6 of the conductive pad 440 may be substantially the same as or different from the width W3 of the conductive pad 240.

In some embodiments, the thickness T1 and the thickness T3 may be equal to or greater than about 0.2 µm. In some embodiments, the thickness T1 and the thickness T3 may be from about 0.2 µm to about 3.5 µm (e.g., 0.4 µm, 0.6 µm, 1 µm, 2 µm or 3 µm). In some embodiments, the thickness T2 and the thickness T4 may be from about 0.1 µm to about 3 µm (e.g., 0.3 µm, 0.5 µm, 0.8 µm, 1 µm or 2 µm). In some embodiments, the ratio T1/T2 of the thickness T1 to the thickness T2 is equal to or greater than about 2. In some embodiments, the ratio T3/T4 of the thickness T3 to the thickness T4 is equal to or greater than about 2.

Figure 2B:
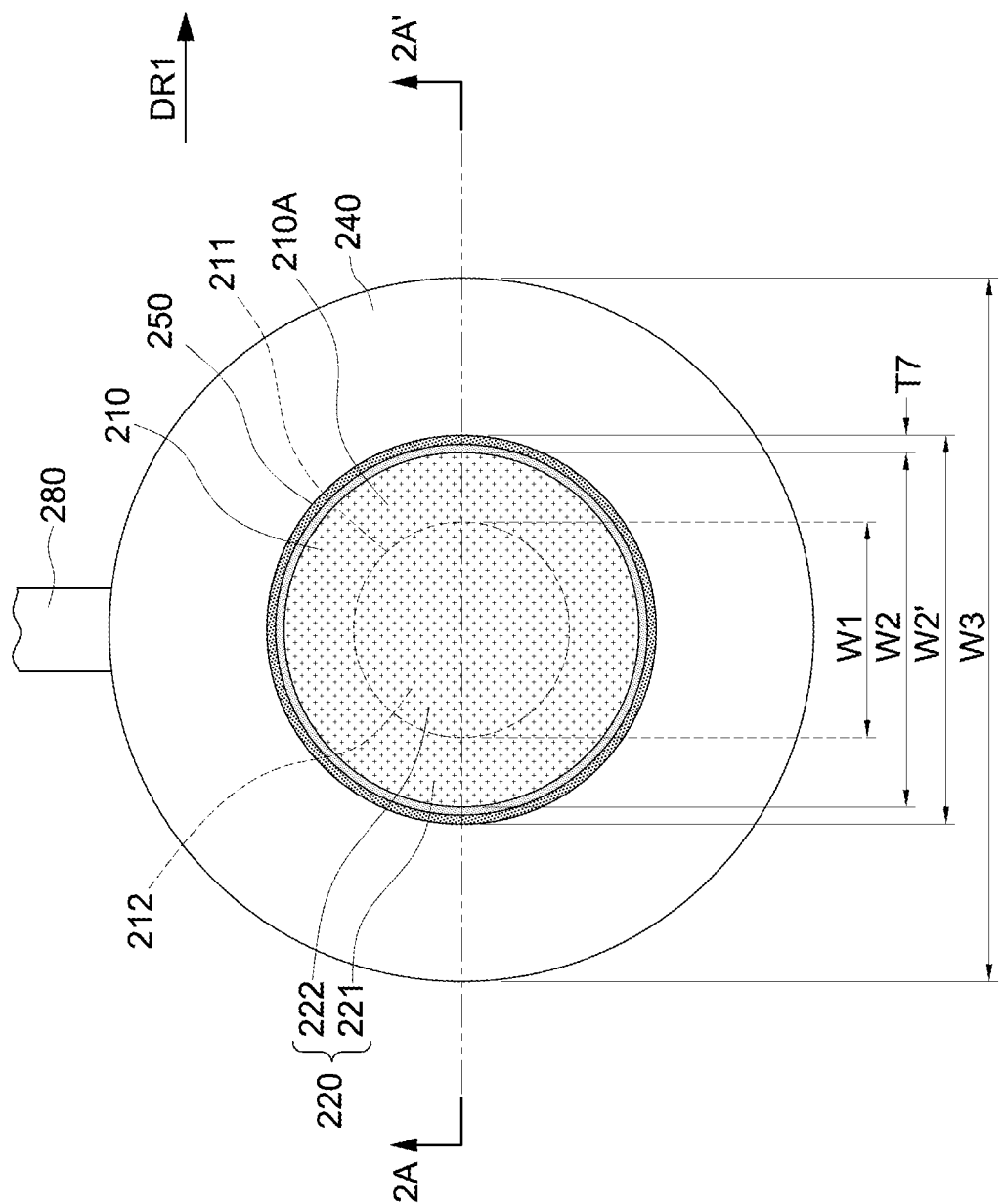
FIG. 2B illustrates a top view of a bonding structure in accordance with some embodiments of the present disclosure.

FIG. 2B illustrates a top view of a bonding structure 20 in accordance with some embodiments of the present disclosure. In some embodiments, FIG. 2B illustrates a cross-sectional view of a bonding structure 20 along the cross-sectional line 2A-2A' in FIG. 2A. The bonding structure 20 is similar to the bonding structure 10 in FIG. 1 except that, for example, the bonding structure 20 further includes a seed layer 250. It should be noted that some components are omitted in FIG. 2B for clarity.

In some embodiments, the seed layer 250 surrounds the portion 221 of the bonding layer 220 and the lateral surface 211 of the conductive layer 210. In some embodiments, a peripheral region of the conductive pad 240 is exposed from and surrounds the seed layer 250 from a top view perspective.

Figure 3A:
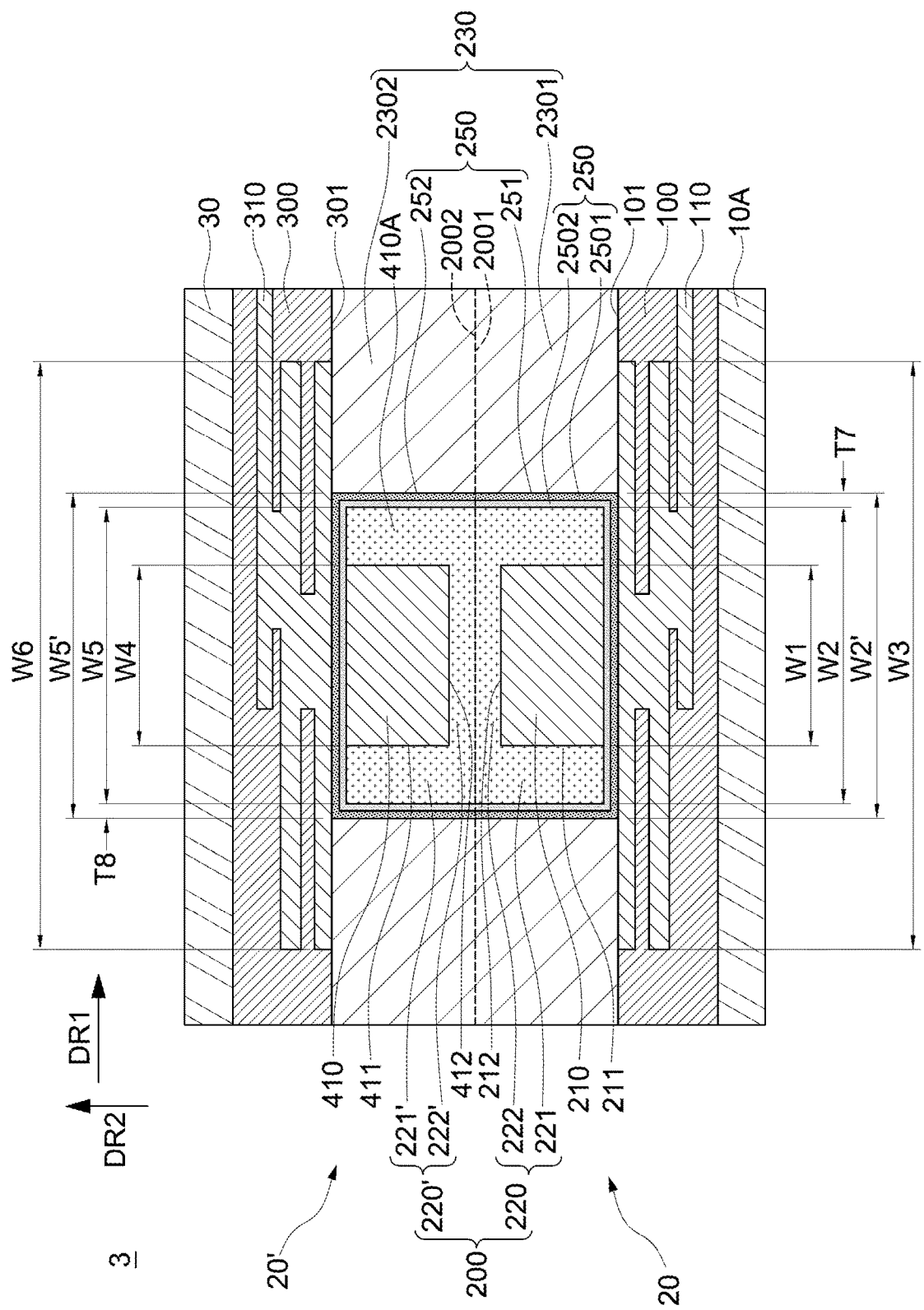
FIG. 3A illustrates a cross-sectional view of a package structure in accordance with some embodiments of the present disclosure.

FIG. 3A illustrates a cross-sectional view of a package structure 3 in accordance with some embodiments of the present disclosure. The package structure 3 is similar to the package structure 2 in FIG. 2A except that, for example, the bonding structure 20 is disposed on the substrate 100.

In some embodiments, the bonding structure 20 is directly on the substrate 100. In some embodiments, the redistribution layer 110 of the substrate 100 is electrically connected to the conductive layer 210 through the seed layer 250 (e.g., the portion 251 of the seed layer 250). In some embodiments, a trace of the redistribution layer 110 directly contacts the seed layer 250 of the bonding structure 20.

In some embodiments, the bonding structure 20' is directly on the substrate 300. In some embodiments, the redistribution layer 310 of the substrate 300 is electrically connected to the conductive layer 410 through the seed layer 250 (e.g., the portion 252 of the seed layer 250). In some embodiments, a trace of the redistribution layer 310 directly contacts the seed layer 250 of the bonding structure 20.

Figure 3B:
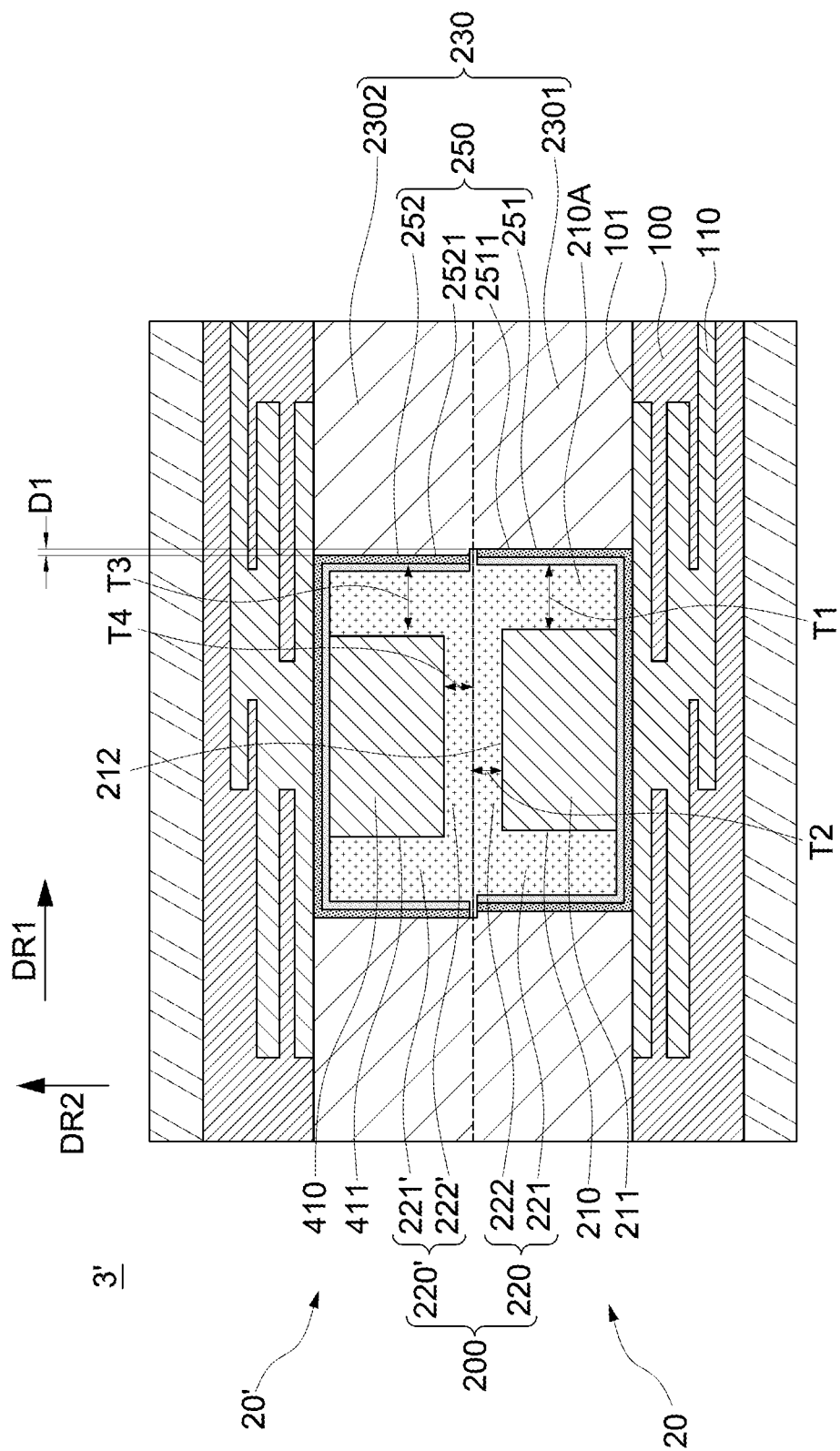
FIG. 3B illustrates a cross-sectional view of a package structure in accordance with some embodiments of the present disclosure.

FIG. 3B illustrates a cross-sectional view of a package structure 3' in accordance with some embodiments of the present disclosure. The package structure 3' is similar to the package structure 3 in FIG. 3A except that, for example, the bonding structure 20 is misaligned with the bonding structure 20'.

In some embodiments, the portion 251 of the seed layer 250 and the portion 252 of the seed layer 250 are discontinuous. In some embodiments, a lateral surface 2511 of the portion 251 of the seed layer 250 is substantially non-coplanar with a lateral surface 2521 of the portion 252 of the seed layer 250. In some embodiments, a distance D1 between the lateral surface 2511 of the portion 251 of the seed layer 250 and the lateral surface 2521 of the portion 252 of the seed layer 250 is equal to or greater than 1 μm. In some embodiments, the distance D1 between the lateral surface 2511 and the lateral surface 2521 is from about 1 μm to about 2 μm (e.g., 1.2 μm, 1.4 μm, 1.6 μm or 1.8 μm). In some embodiments, a portion of the bonding layer 220 is between the portion 251 of the seed layer 250 and the portion 252 of the seed layer 250. In some embodiments, a portion of the bonding layer 220' is between the portion 251 of the seed layer 250 and the portion 252 of the seed layer 250.

Figure 4A:
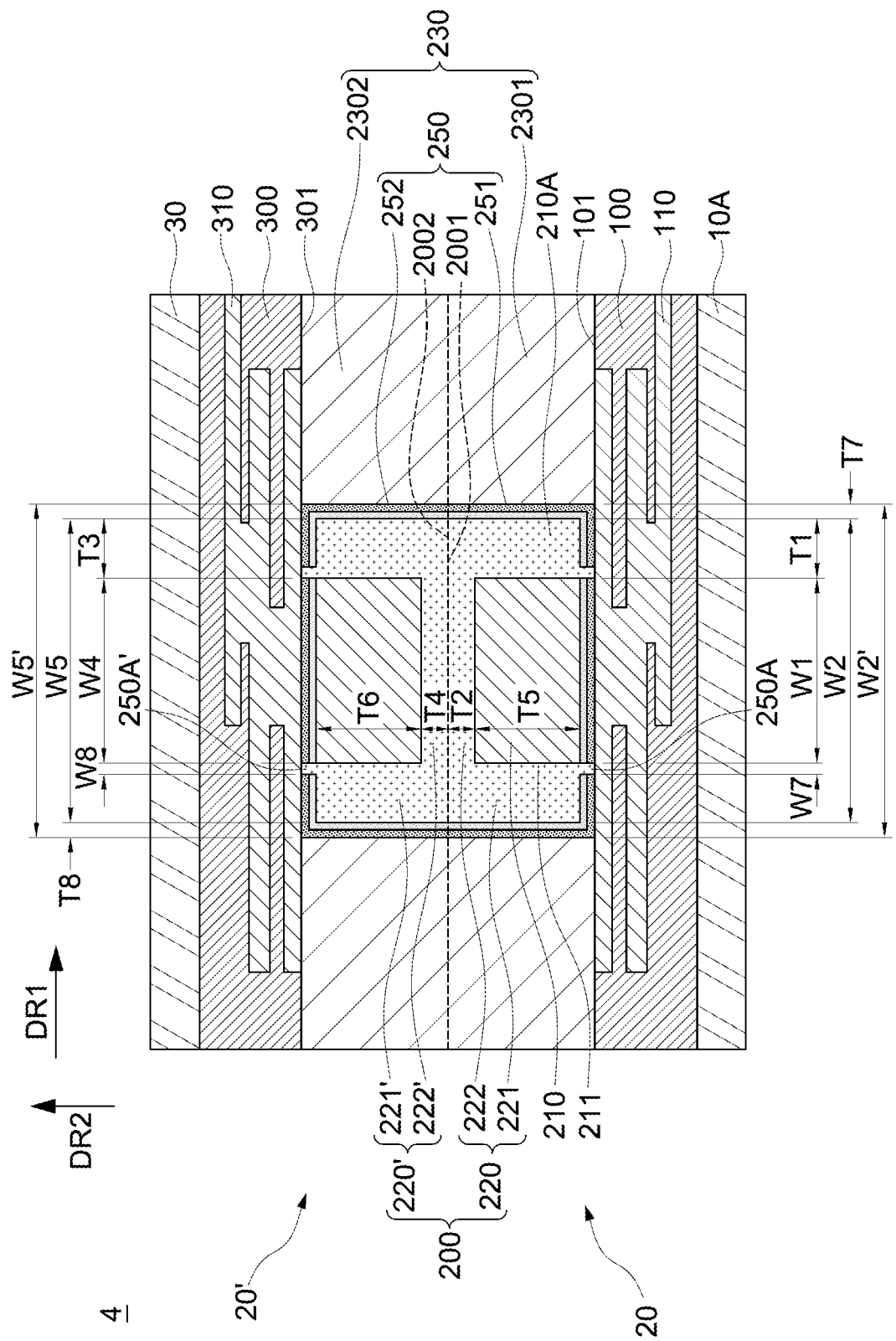
FIG. 4A illustrates a cross-sectional view of a package structure in accordance with some embodiments of the present disclosure.

FIG. 4A illustrates a cross-sectional view of a package structure 4 in accordance with some embodiments of the present disclosure. The package structure 4 is similar to the package structure 3 in FIG. 3A except that, for example, the seed layer 250 has a different structure.

In some embodiments, the seed layer 250 defines an opening 250A above the substrate 100. In some embodiments, the portion 251 of the seed layer 250 defines the opening 250A above the substrate 100. In some embodiments, the bonding layer 220 passes through the opening 250A and directly contacts the surface 101 of the substrate 100. In some embodiments, the bonding layer 220 passes through the opening 250A and directly contacts a portion of the redistribution layer 110 of the substrate 100. In some embodiments, the portion 251 of the seed layer 250 extends along the direction DR1 on the surface 101 of the substrate 100. In some embodiments, a width W7 of the opening 250A is less than the thickness T1 of the portion 221 of the bonding layer 220.

In some embodiments, the portion 252 of the seed layer 250 defines an opening 250A' above the substrate 300. In some embodiments, the bonding layer 220' passes through the opening 250A' and directly contacts the surface 301 of the substrate 300. In some embodiments, the bonding layer 220' passes through the opening 250A' and directly contacts a portion of the redistribution layer 310 of the substrate 300. In some embodiments, the portion 252 of the seed layer 250 extends along the direction DR1 on the surface 301 of the substrate 300. In some embodiments, a width W8 of the opening 250A' is less than the thickness T3 of the portion 221' of the bonding layer 220'.

According to some embodiments of the present disclosure, with the design of the seed layer 250 defining the opening(s) 250A/250A', not only the formation area of the bonding layer(s) 220/220' by electroless plating can be increased, but the opening(s) 250A/250A' can also provide additional space(s) for accommodating portion(s) of the bonding layer(s) 220/220' resulting from overly rapid formation of the bonding layer(s) 220/220'. Therefore, the formation rate of the bonding layer(s) 220/220' can be significantly increased, while the bonding layer(s) 220/220' overly rapidly formed to largely exceed over the upper surface of the passivation layer(s) 2301/2302 can be effectively prevented.

In some embodiments, a width W2' (i.e., a sum of two times the thickness T7 and the width W2) of the bonding surface 2001 may be from about 1.8 μm to about 136 μm (e.g., 3.2 μm, 14 μm, 40 μm, 80 μm or 130 μm). In some embodiments, a width W5' (i.e., a sum of two times the thickness T8 and the width W5) of the bonding surface 2002 may be from about 1.8 μm to about 136 μm (e.g., 3.2 μm, 14 μm, 40 μm, 80 μm or 130 μm). In some embodiments, the width W5' of the bonding surface 2002 may be substantially the same as or different from the width W2' of the bonding surface 2001.

In some embodiments, the thickness T1 and the thickness T3 may be from about 0.2 μm to about 6.6 μm (e.g., 0.4 μm, 1 μm, 2 μm, 4 μm or 6 μm). In some embodiments, the thickness T2 and the thickness T4 may be from about 0.1 μm to about 3 μm (e.g., 0.3 μm, 0.5 μm, 0.8 μm, 1 μm or 2 μm). In some embodiments, the ratio T1/T2 of the thickness T1 to the thickness T2 is equal to or greater than about 2.2. In some embodiments, the ratio T3/T4 of the thickness T3 to the thickness T4 is equal to or greater than about 2.2.

Figure 4B:
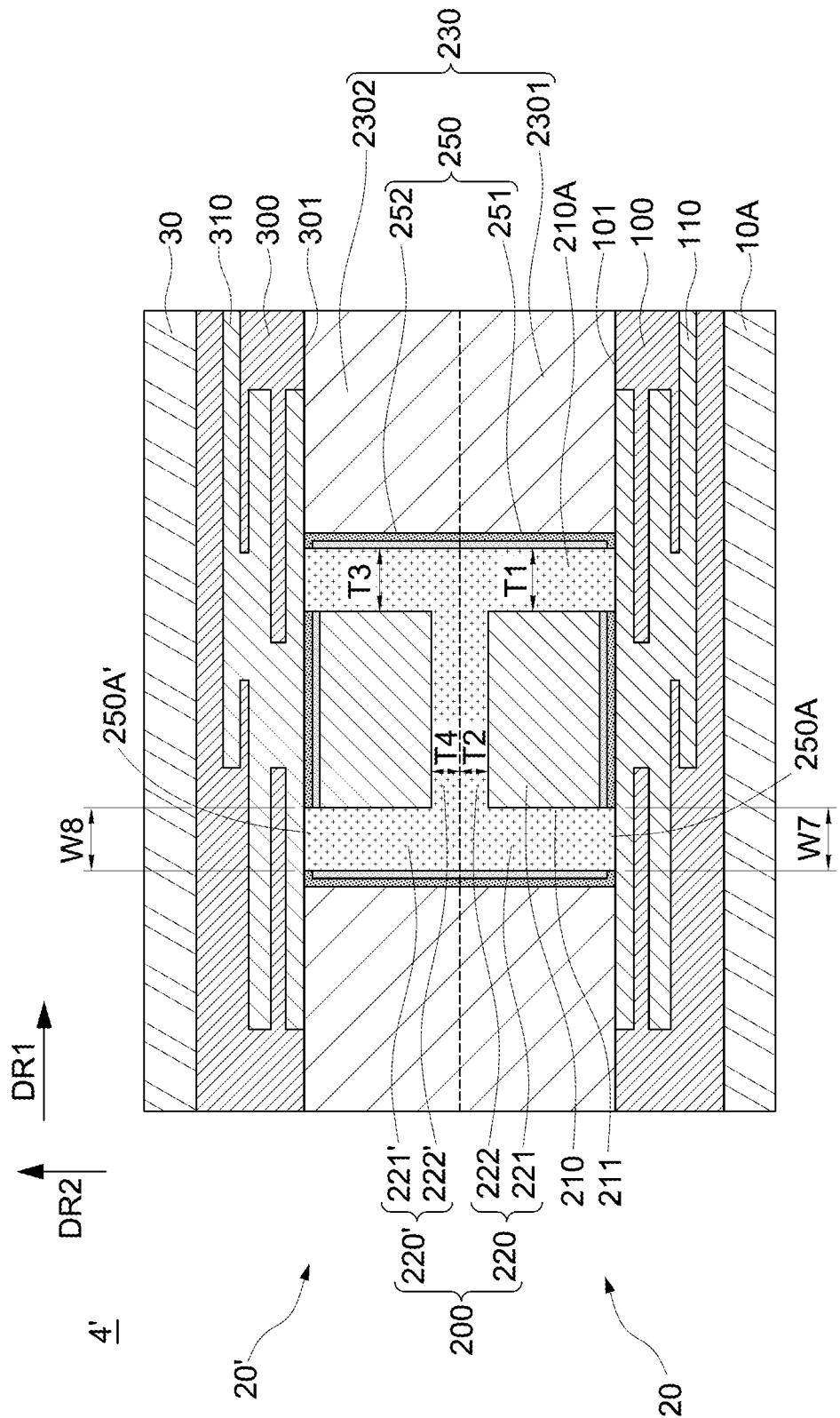
FIG. 4B illustrates a cross-sectional view of a package structure in accordance with some embodiments of the present disclosure.

FIG. 4B illustrates a cross-sectional view of a package structure 4' in accordance with some embodiments of the present disclosure; The package structure 4' is similar to the package structure 4 in FIG. 4A except that, for example, the seed layer 250 has a different structure.

In some embodiments, the portion 221 of the bonding layer 220 passes through the opening 250A and directly contacts a portion of the redistribution layer 110 of the substrate 100. In some embodiments, the width W7 of the opening 250A is substantially the same as the thickness T1 of the portion 221 of the bonding layer 220.

In some embodiments, the portion 221' of the bonding layer 220' passes through the opening 250A' and directly contacts a portion of the redistribution layer 310 of the substrate 300. In some embodiments, the width W8 of the opening 250A' is substantially the same as the thickness T3 of the portion 221' of the bonding layer 220'.

Figure 5:
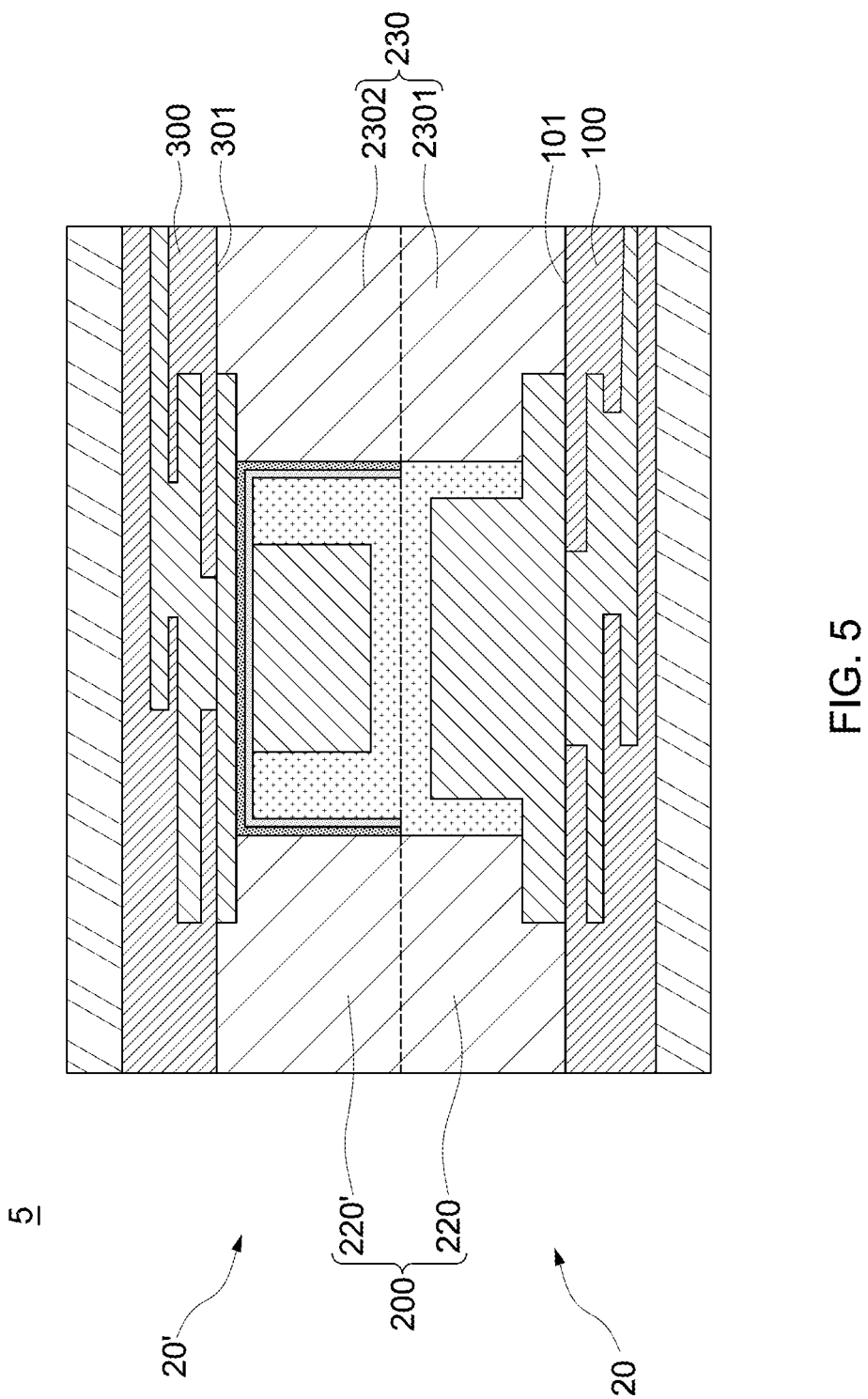
FIG. 5 illustrates a cross-sectional view of a package structure in accordance with some embodiments of the present disclosure.

FIG. 5 illustrates a cross-sectional view of a package structure 5 in accordance with some embodiments of the present disclosure. The package structure 5 is similar to the package structure 1 in FIG. 1B except that, for example, the bonding structure 200 has a different structure.

In some embodiments, the package structure 5 includes bonding structures 10 and 20'. In some embodiments, the bonding structure 10 has a structure similar to that of the bonding structure 10 illustrated in FIG. 1B. In some embodiments, the bonding structure 20' has a structure similar to that of the bonding structure 20' illustrated in FIG. 2A.

Figure 6:
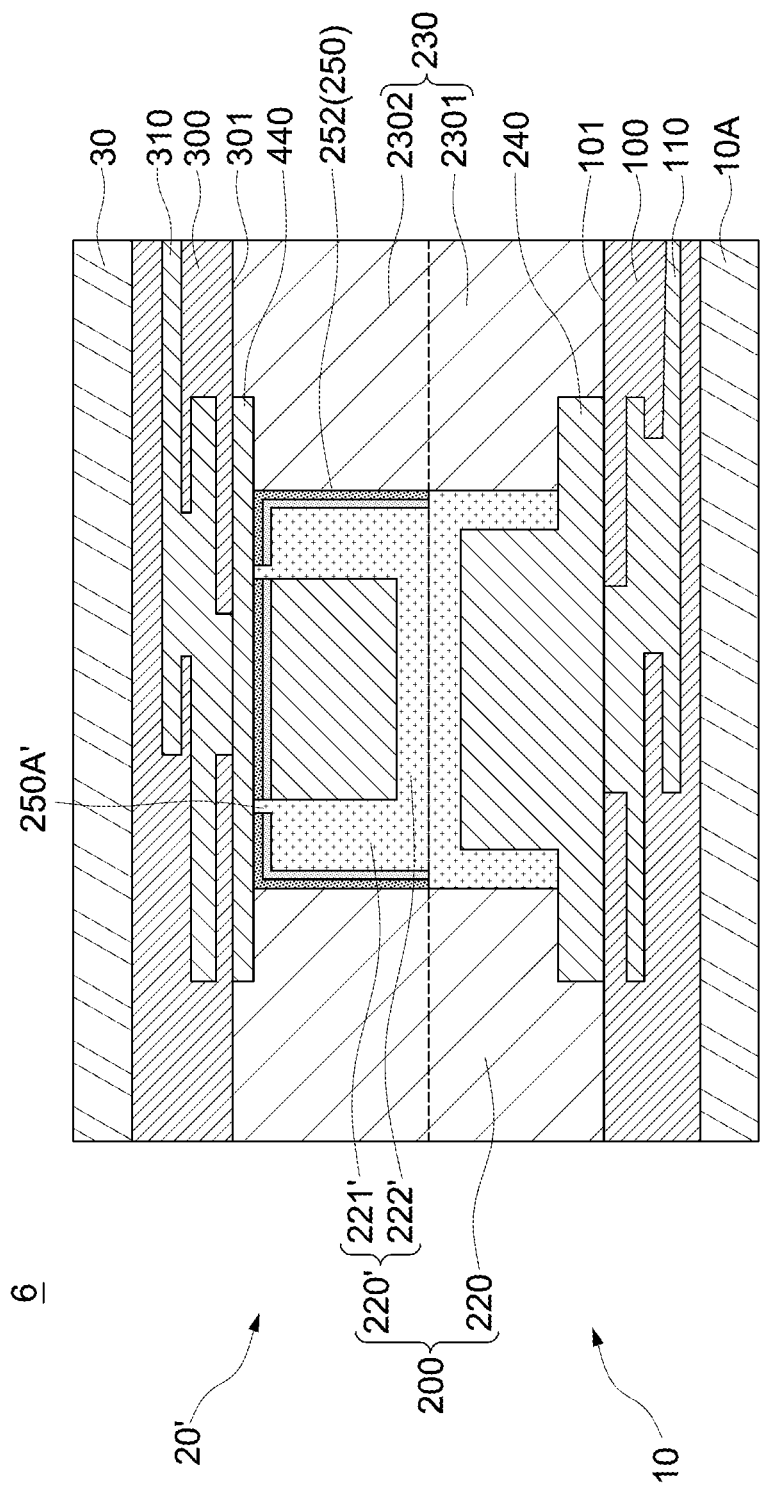
FIG. 6 illustrates a cross-sectional view of a package structure in accordance with some embodiments of the present disclosure.

FIG. 6 illustrates a cross-sectional view of a package structure 6 in accordance with some embodiments of the present disclosure. The package structure 6 is similar to the package structure 1 in FIG. 1B except that, for example, the bonding structure 200 has a different structure.

In some embodiments, the package structure 6 includes bonding structures 10 and 20'. In some embodiments, the bonding structure 10 has a structure similar to that of the bonding structure 10 illustrated in FIG. 1B. In some embodiments, the bonding structure 20' in FIG. 6 has a structure similar to that of the bonding structure 20' illustrated in FIG. 4A, except that the bonding structure 20' in FIG. 6 further includes the conductive pad 440 on the surface 301 of the substrate 300. In some embodiments, the portion 221' of the bonding layer 220' passes through the opening 250A' and directly contacts the conductive pad 440.

Figure 7:
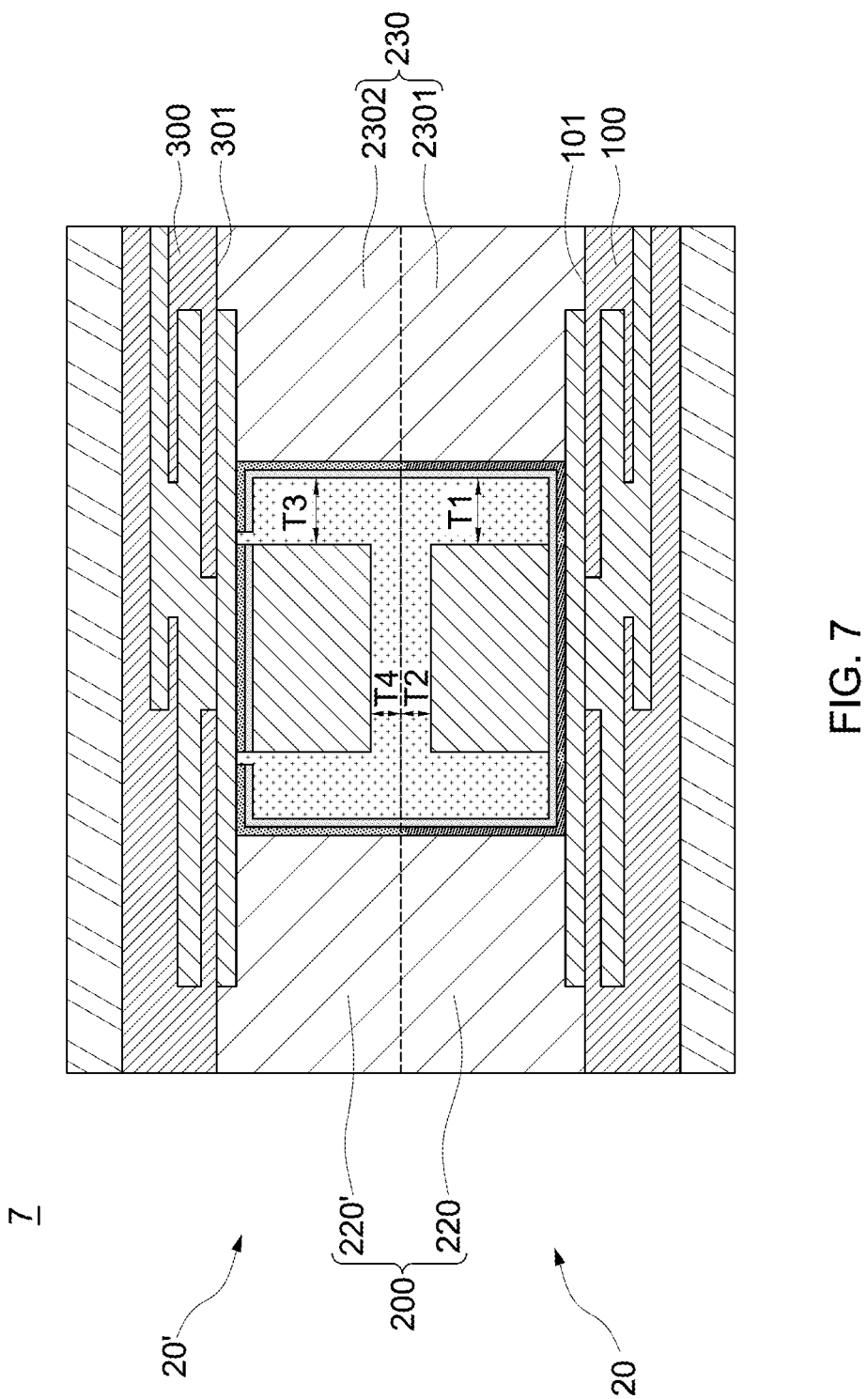
FIG. 7 illustrates a cross-sectional view of a package structure in accordance with some embodiments of the present disclosure.

FIG. 7 illustrates a cross-sectional view of a package structure 7 in accordance with some embodiments of the present disclosure. The package structure 7 is similar to the package structure 6 in FIG. 6 except that, for example, the bonding structure 200 has a different structure.

In some embodiments, the package structure 6 includes bonding structures 20 and 20'. In some embodiments, the bonding structure 20 has a structure similar to that of the bonding structure 20 illustrated in FIG. 2A. In some embodiments, the bonding structure 20' has a structure similar to that of the bonding structure 20' illustrated in FIG. 6.

FIG. 8A, FIG. 8B, FIG. 8C, FIG. 8D, FIG. 8E, FIG. 8F, FIG. 8G, FIG. 8H and FIG. 8I illustrate various operations in a method of manufacturing a package structure 1 in accordance with some embodiments of the present disclosure.

Referring to FIG. 8A, a carrier 10A is provided, a substrate 100 including a redistribution layer 110 is formed on the carrier 10A, and a conductive pad 240 is formed on the substrate 100. A seed layer 810 may be optionally formed on the substrate 100, and then the conductive pad 240 may be formed on the seed layer 810. The seed layer 810 may be formed by a physical vapor deposition (PVD) process. In some embodiments, the conductive pad 240 may be formed by forming a patterned photoresist PR1 on the seed layer 810, the patterned photoresist PR1 defining an opening O1 exposing a portion of the seed layer 810; and forming the conductive pad 240 on the seed layer 810 in the opening O1 of the patterned photoresist PR1. The conductive pad 240 may be formed by a plating process.

Referring to FIG. 8B, the patterned photoresist PR1 is removed, and a patterned photoresist PR2 defining an opening O2 above the conductive pad 240 is formed on the conductive pad 240 and the substrate 100. The patterned photoresist PR1 may be removed by striping.

Referring to FIG. 8C, a conductive layer 210 is formed on the substrate 100. In some embodiments, the conductive layer 210 may be formed in the opening O2 of the patterned photoresist PR2 by a plating process.

Referring to FIG. 8D, the patterned photoresist PR2 is removed. In some embodiments, a portion of the seed layer 810 under the patterned photoresist PR2 is removed. The patterned photoresist PR2 and the portion of the seed layer 810 may be removed by striping and wet etching.

Figure 8E:
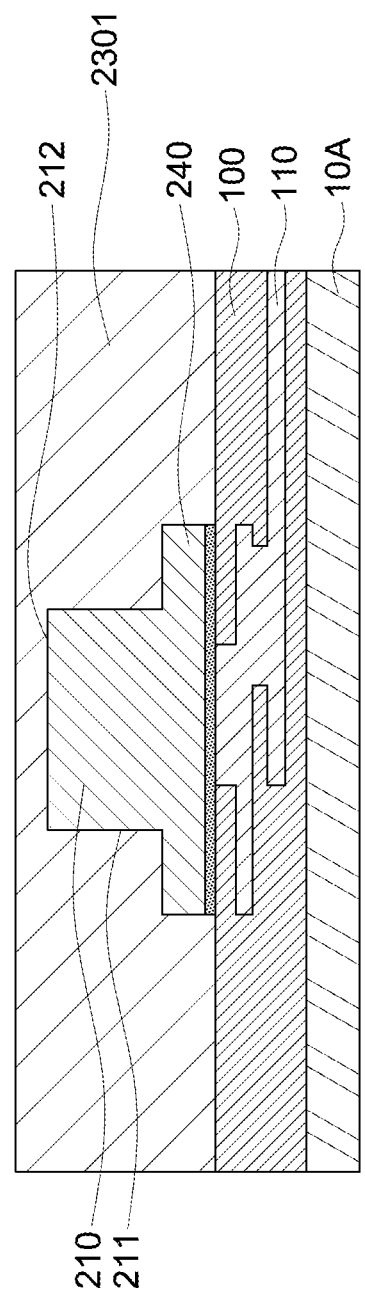

Referring to FIG. 8E, a passivation layer 2301 is formed on the conductive layer 210 and the substrate 100. In some embodiments, the conductive layer 210 has a lateral surface 211 and an upper surface 212 angled with the lateral surface 211, and the passivation layer 2301 covers the lateral surface 211 and the upper surface 212 of the conductive layer 210.

Figure 8F:
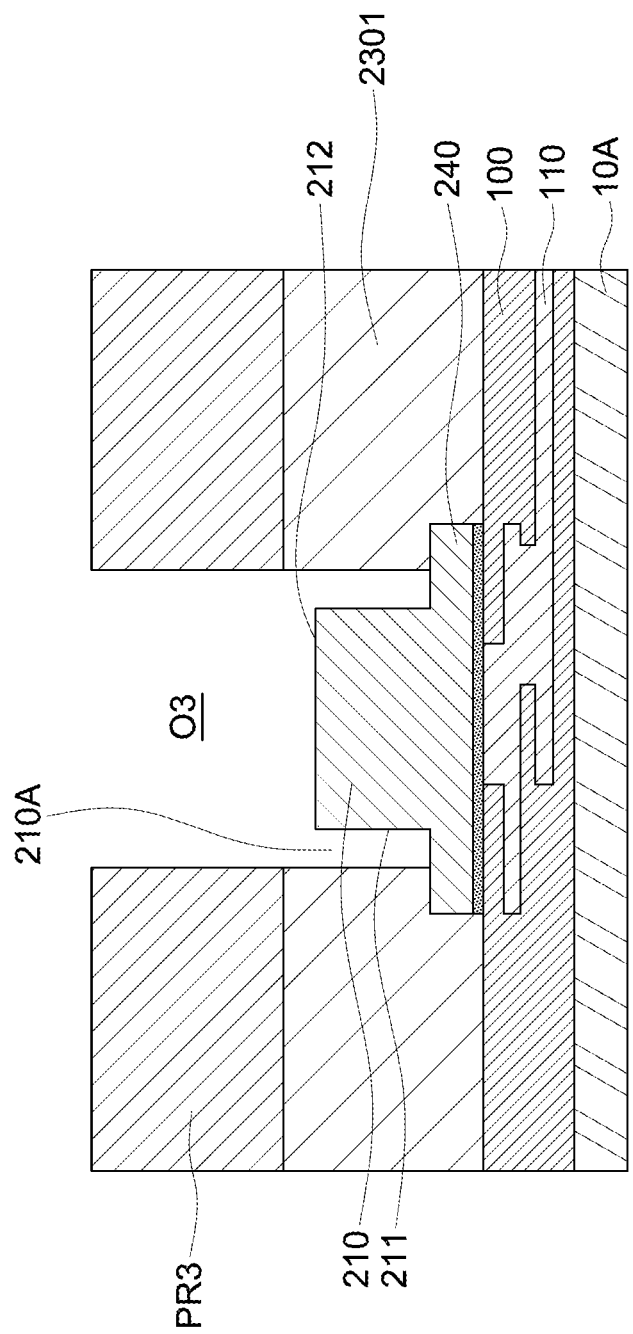

Referring to FIG. 8F, a portion of the passivation layer 2301 is removed to form a trench 210A between the passivation layer 2301 and the lateral surface 211 of the conductive layer 210. In some embodiments, a patterned photoresist PR3 defining an opening O3 above the conductive layer 210 is formed on the passivation layer 2301, and a portion of the passivation layer 2301 exposed from the opening O3 may be removed to form the trench 210A. The portion of the passivation layer 2301 may be removed by a dry etching process.

Figure 8G:
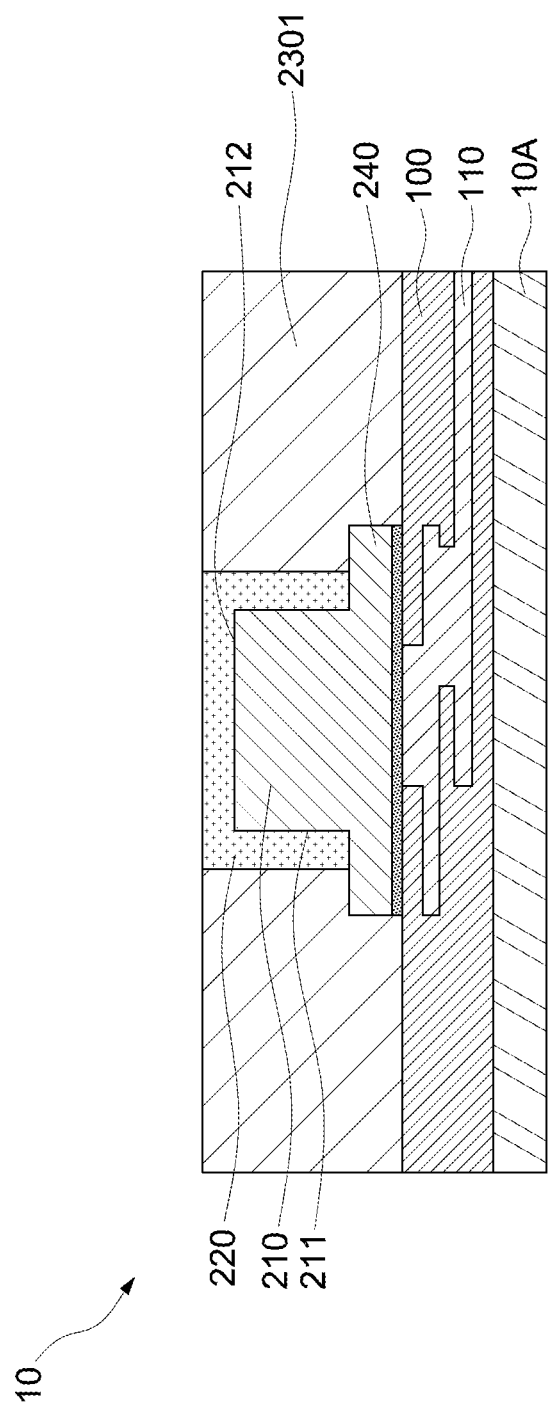

Referring to FIG. 8G, the patterned photoresist PR3 is removed, and a bonding layer 220 is formed on the lateral surface 211 and the upper surface 212 of the conductive layer 210. The patterned photoresist PR3 may be removed by striping. In some embodiments, a conductive material may be formed on the upper surface 212 of the conductive layer 210 and in the trench 210A defined by the passivation layer 2301 and the lateral surface 211 of the conductive layer 210 to form the bonding layer 220. As such, a bonding structure 10 is formed.

In some embodiments, the bonding layer 220 may be formed by an electroless plating process. The lateral surface 211 of the conductive layer 210 may serve as the formation area of the bonding layer 220 by electroless plating. According to some embodiments of the present disclosure, by utilizing electroless plating to form the bonding layer 220, operations of the arrangement of electrodes for electro-plating the bonding layer 220 and the removal of these electrodes after the bonding layer 220 being formed can be omitted. Therefore, the manufacturing process of forming the package structure can be simplified, and possible damage to the structures resulted from the arrangement and removal of electrodes for electro-plating can be effectively prevented.

Referring to FIG. 8H, a bonding structure 10' is formed. In some embodiments, the bonding structure 10' may be formed by providing a carrier 30; forming a substrate 300 on the carrier 30; forming a conductive layer 410 on the substrate 300, the conductive layer 410 having a lateral surface 411 and a lower surface 412 angled with the lateral surface 411; and forming a bonding layer 220' on the lateral surface 411 and the lower surface 412 of the conductive layer 410. In some embodiments, the bonding layer 220' may be formed by an electroless plating process. The lateral surface 411 of the conductive layer 410 may serve as the formation area of the bonding layer 220' by electroless plating. In some embodiments, the bonding structure 10' may be formed by operations similar to those for forming the bonding structure 10.

Figure 8I:
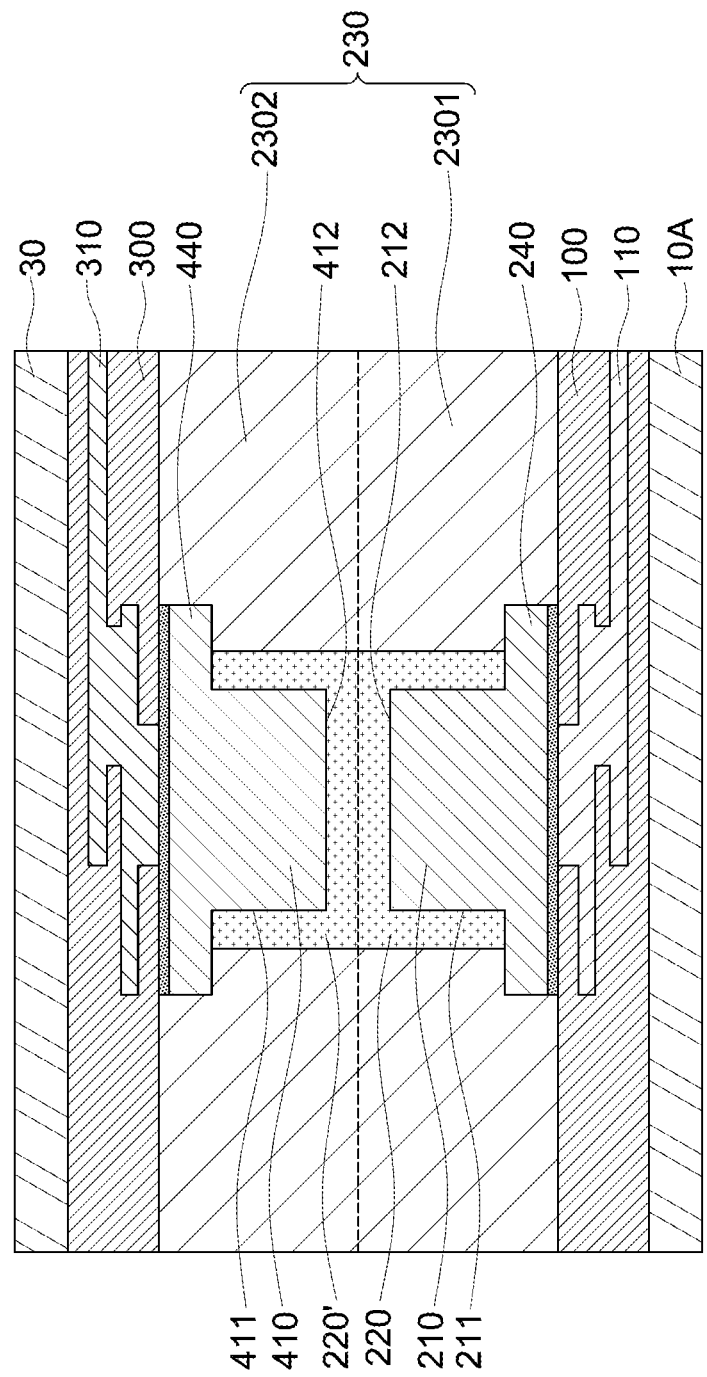

Referring to FIG. 8I, the bonding layer 220 is bonded to the bonding layer 220'. In some embodiments, the passivation layer 2301 is bonded to the passivation layer 2302. In some embodiments, the passivation layer 2301 is bonded to the passivation layer 2302 prior to bonding the bonding layer 220 and the bonding layer 220', and finally a hybrid bonding structure 200 is formed. As such, the package structure 1 is formed.

Figure 12:
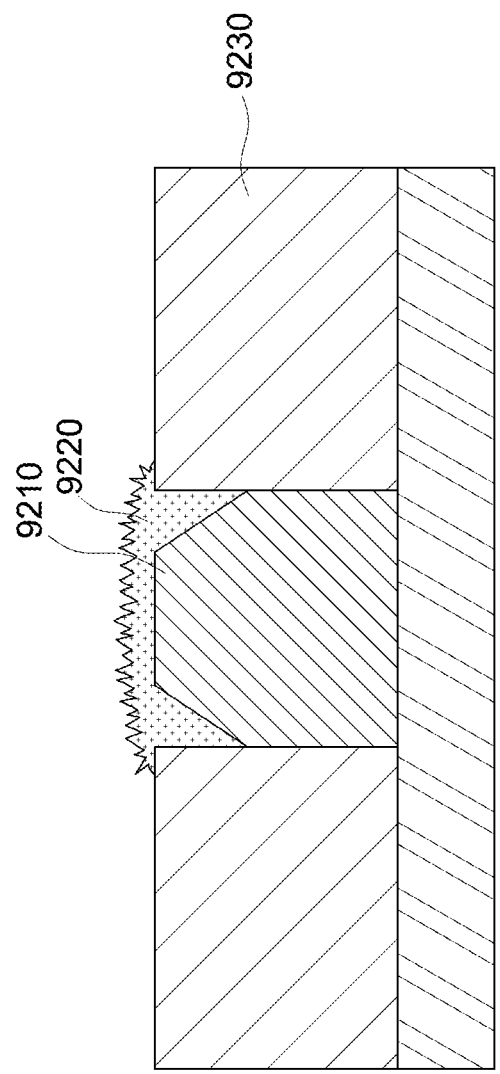
FIG. 12 illustrates a cross-sectional view of a package structure in accordance with some comparative embodiments of the present disclosure.
Figure 13:
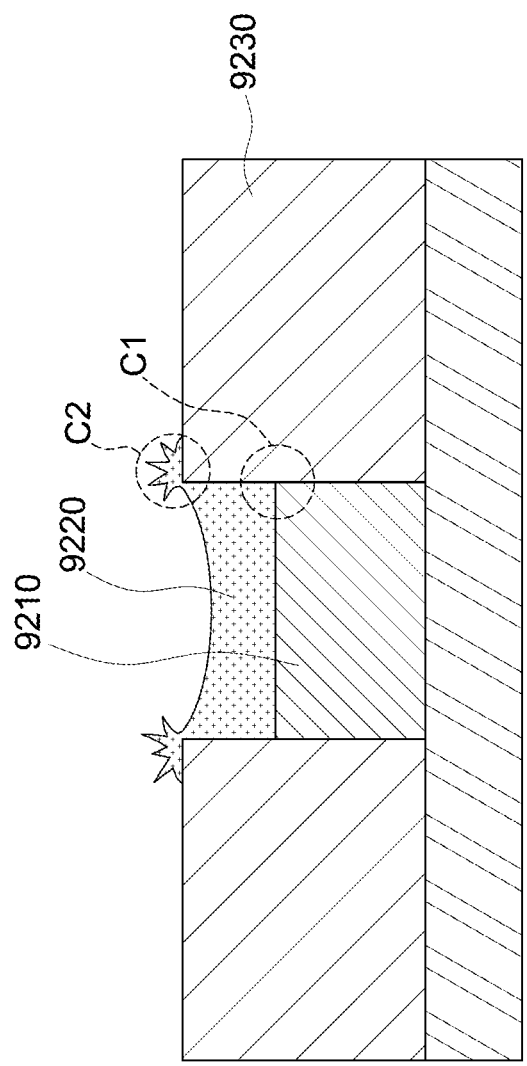
FIG. 13 illustrates a cross-sectional view of a package structure in accordance with some comparative embodiments of the present disclosure.

In some comparative embodiments (e.g., those illustrated in FIG. 12), before a conductive layer (or pad) 9210 within a passivation layer 9230 is bonded to another conductive layer (or pad) on another substrate, a polishing process (e.g., a CMP process) is performed on the conductive layer (or pad) 9210 and the passivation layer 9230 to expose the bonding surface of the conductive layer (or pad) 9210 from the passivation layer 9230 and form planarized bonding surfaces of the conductive layer (or pad) 9210 and the passivation layer 9230. However, erosion may occur on the polished surfaces, especially from the junction of the conductive layer (or pad) 9210 and the passivation layer 9230, which may result in delamination in the subsequently formed hybrid bonding structure. To solve the above issues, an additional conductive material 9220 may be plated on the polished surface to fill into the cavities resulted from the erosion, prior to a bonding process. Nevertheless, since the erosion at different regions of the polished surface may vary, over-plating may occur on some regions and the plated conductive material 9220 may be formed with an upper surface that is relatively rough or having irregular micro-structures, which adversely affects the morphology of the bonding surface and causes issues, such as misalignment or delamination in the subsequently formed hybrid bonding structure. In some other comparative embodiments (e.g., those illustrated in FIG. 13), a CMP process is omitted and the conductive layer (or pad) 9210 has an upper surface below an upper surface of the passivation layer 9230, an additional conductive material 9220 may be applied on the conductive layer (or pad) 9210. However, due to the crystalline disorder occurred at the interface (e.g., the corner C1) between the conductive layer (or pad) 9210 and the passivation layer 9230, the conductive material 9220 may be formed with a greater thickness at the corner C2 (i.e., the conductive material may have a concave upper surface) and the upper surface of the conductive material 9220 is relatively rough or has irregular micro-structures, and thus cannot solve the above-mentioned issues, either.

In contrast, according to some embodiments of the present disclosure, the conductive layer 210 is located within the cavity defined by the first passivation layer 2301 and the substrate 100, the cavity includes a space for forming the bonding layer 220, e.g., on a lateral surface 211 and/or on the upper surface 212 of the conductive layer 210 (specifically, the bonding layer 22 may be formed in the trench 210A defined by the passivation layer 2301 and the conductive layer 210), such that the bonding surface of the bonding layer 220 can be free from a polishing process (e.g., a CMP process) prior to a bonding process and the bonding layer 220 may be formed with a smoother upper surface.

In addition, according to some embodiments of the present disclosure, the trench 210A is reserved for accommodating the bonding layer 220 formed by electroless plating, and thus over-plating of the bonding layer 220 can be effectively prevented. Therefore, the bonding surface of the bonding layer 220 can be substantially coplanar with or slightly protruded from the bonding surface (i.e., the upper surface) of the passivation layer 2301, thus misalignment of bonding can be prevented, and the subsequently formed hybrid bonding structure can be substantially free from delamination.

FIG. 9A, FIG. 9B, FIG. 9C, FIG. 9D, FIG. 9E, FIG. 9F, FIG. 9G and FIG. 9H illustrate various operations in a method of manufacturing a package structure 3 in accordance with some embodiments of the present disclosure.

Figure 9A:
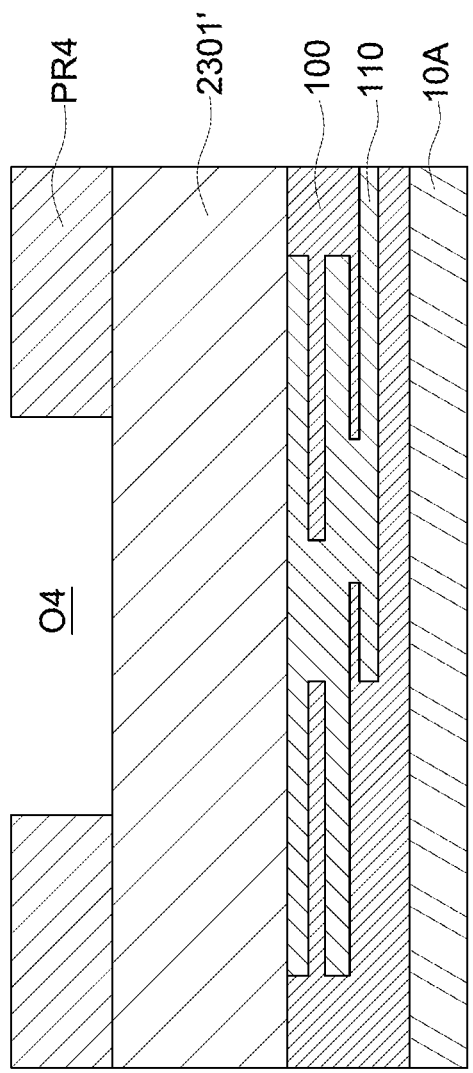
FIG. 9A, FIG. 9B, FIG. 9C, FIG. 9D, FIG. 9E, FIG. 9F, FIG. 9G and FIG. 9H illustrate various operations in a method of manufacturing a package structure in accordance with some embodiments of the present disclosure.

Referring to FIG. 9A, a carrier 10A is provided, a substrate 100 including a redistribution layer 110 is formed on the carrier 10A, a passivation layer 2301' is formed on the substrate 100, and a patterned photoresist PR4 defining an opening O4 is formed on the passivation layer 2301'. The passivation layer 2301' may be formed by a chemical vapor deposition (CVD) process. The patterned photoresist PR4 may be formed by a dry etch process, such as a deep reactive ion etching (DRIE) process.

Figure 9B:
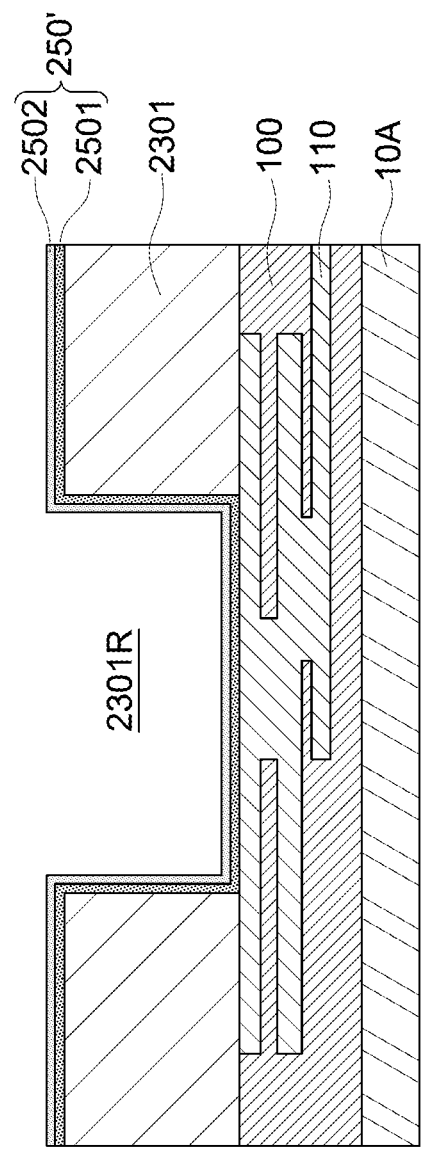

Referring to FIG. 9B, the patterned photoresist PR4 is removed, a portion of the passivation layer 2301' exposed from the opening O4 is removed to form a passivation layer 2301 defining a recess 2301R, and a seed layer 250' is formed on the passivation layer 2301 and the substrate 100. The patterned photoresist PR4 may be removed by striping. In some embodiments, the seed layer 250' is formed in the recess 2301R. In some embodiments, the seed layer 250' includes a sub-layer 2501 directly contacting the passivation layer 2301 and a sub-layer 2502 on the sub-layer 2501. The seed layer 250' may be formed by plating or PVD technique.

Figure 9C:
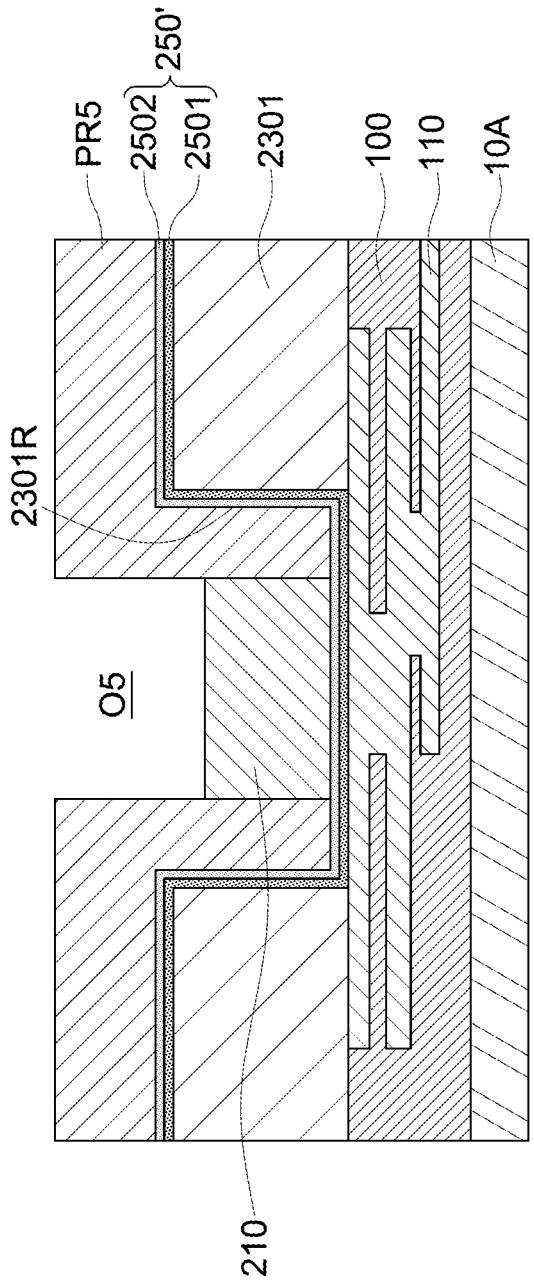

Referring to FIG. 9C, a patterned photoresist PR5 defining an opening O5 within the recess 2301R is formed on the passivation layer 2301 and the substrate 100, and a conductive layer 210 is formed in the opening O5 of the patterned photoresist PR5. The conductive layer 210 may be formed by plating.

Figure 9D:
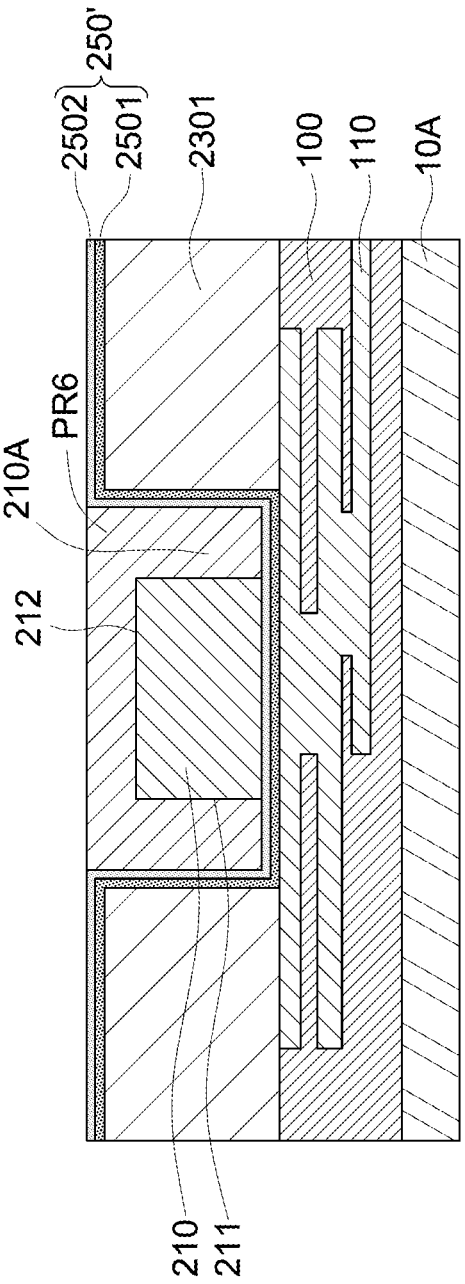

Referring to FIG. 9D, the patterned photoresist PR5 is removed to form a trench 210A between the seed layer 250' and the lateral surface 211 of the conductive layer 210, and a patterned photoresist PR6 is formed on the upper surface 212 of the conductive layer 210 and filled in the trench 210A.

Figure 9E:
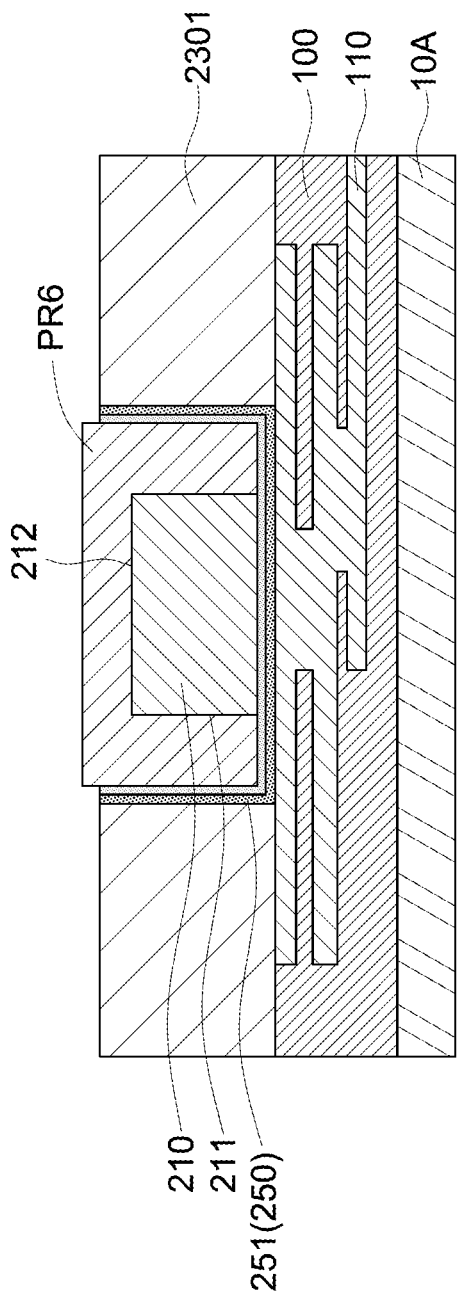

Referring to FIG. 9E, a portion of the seed layer 250' on an upper surface of the passivation layer 2301 is removed. In some embodiments, a wet etching process is performed on the seed layer 250' to remove a portion of the seed layer 250' exposed from the patterned photoresist PR6 so as to form the seed layer 250 (or a portion 251 of a seed layer 250). In some embodiments, a first wet etching process is performed to remove a portion of the sub-layer 2502 leaving the sub-layer 2501 remained substantially intact, and a second wet etching process is then performed to remove a portion of the sub-layer 2501. In some embodiments, the first etching process and the second etching process utilize different etchants to respectively etch away the sub-layer 2502 and the sub-layer 2501.

Figure 9F:
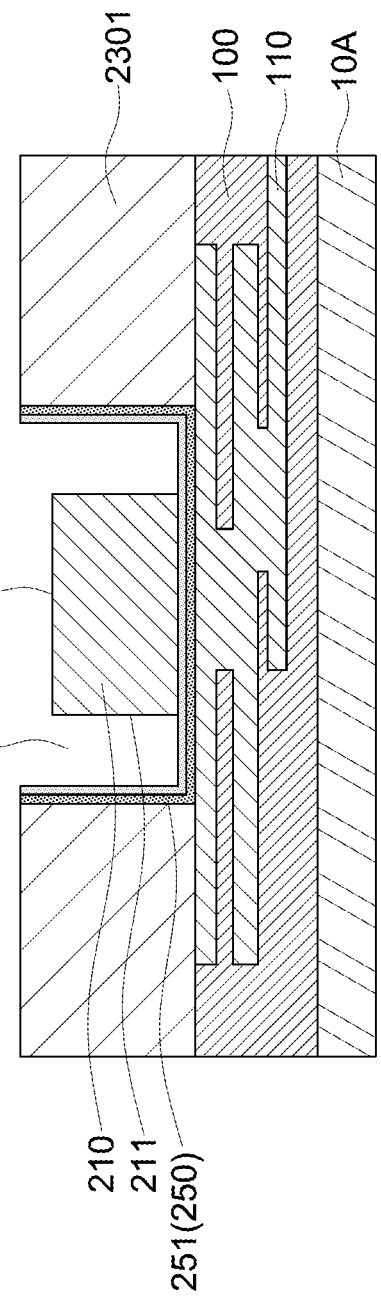

Referring to FIG. 9F, the patterned photoresist PR6 is removed to form the trench 210A defined by the seed layer 250 (or the portion 251 of the seed layer 250) and the lateral surface 211 of the conductive layer 210. The patterned photoresist PR6 may be removed by stripping.

Figure 9G:
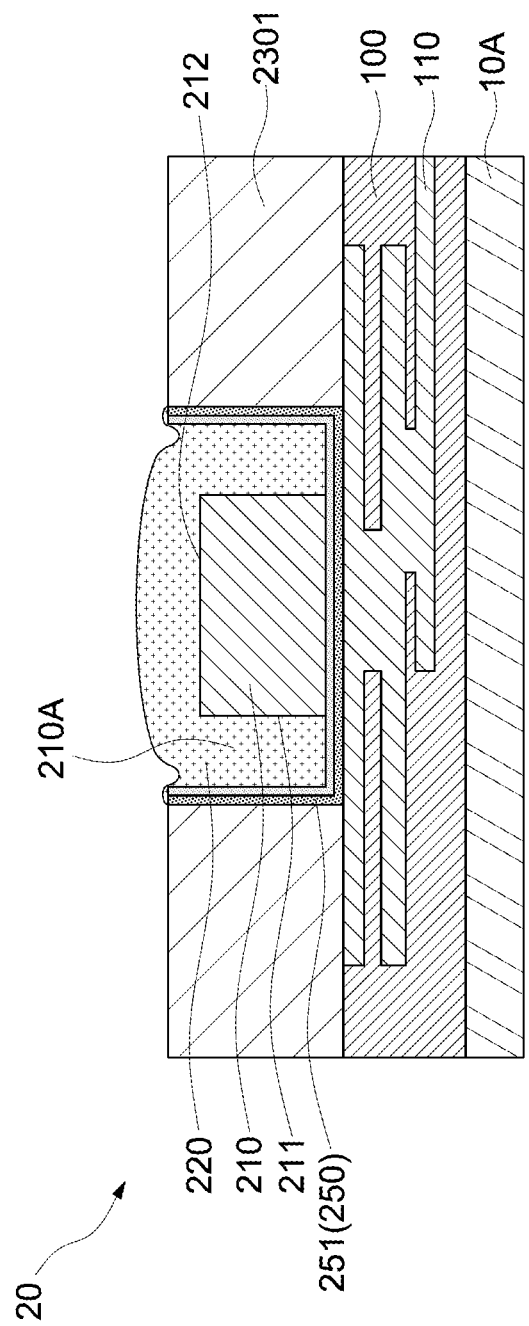

Referring to FIG. 9G, a bonding layer 220 is formed on the lateral surface 211 and the upper surface 212 of the conductive layer 210. In some embodiments, a conductive material may be formed on the upper surface 212 of the conductive layer 210 and in the trench 210A defined by the seed layer 250 (or the portion 251 of the seed layer 250) and the lateral surface 211 of the conductive layer 210 to form the bonding layer 220. In some embodiments, the bonding layer 220 may be formed by an electroless plating process. The lateral surface 211 of the conductive layer 210 and the surface of the seed layer 250 (or the portion 251 of the seed layer 250) may serve as the formation area of the bonding layer 220 by electroless plating. In some embodiments, the bonding layer 220 may be protruded from the upper surface of the passivation layer 2301. As such, a bonding structure 20 is formed.

Figure 9H:
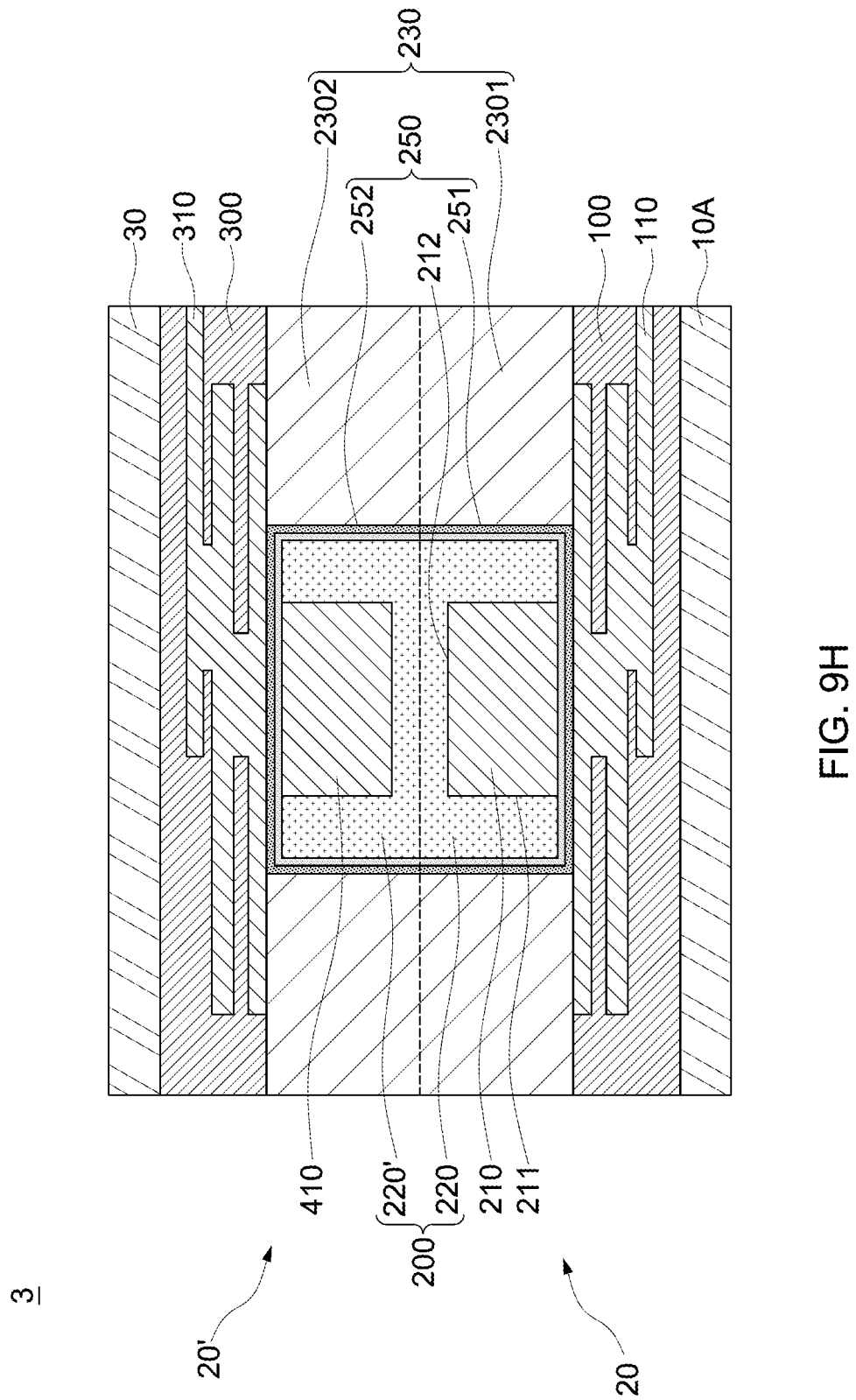

Referring to FIG. 9H, a bonding structure 20' is formed. In some embodiments, the bonding structure 20' may be formed by providing a carrier 30; forming a substrate 300 on the carrier 30; forming a passivation layer 2302 on the substrate 300; forming a seed layer 250 (or a portion 252 of the seed layer 250) on the passivation layer 2302 and the substrate 300; forming a conductive layer 410 on the substrate 300, the conductive layer 410 having a lateral surface 411 and a lower surface 412 angled with the lateral surface 411; and forming a bonding layer 220' on the lateral surface 411 and the lower surface 412 of the conductive layer 410. In some embodiments, the bonding layer 220' may be formed by an electroless plating process. The lateral surface 411 of the conductive layer 410 and the surface of the seed layer 250 (or the portion 251 of the seed layer 250) may serve as the formation area of the bonding layer 220' by electroless plating. In some embodiments, the bonding structure 20' may be formed by operations similar to those for forming the bonding structure 20.

Still referring to FIG. 9H, the bonding layer 220 is bonded to the bonding layer 220'. In some embodiments, the portion 251 of the seed layer 250 is bonded to the portion 252 of the seed layer 250 when bonding the bonding layer 220 to the bonding layer 220'. In some embodiments, the operation of bonding the bonding layer 220 to the bonding layer 220' is performed under a temperature that is lower than a melting point of a material of the conductive layer 210 or a melting point of a material of the conductive layer 410. As such, the package structure 3 is formed.

FIG. 10A, FIG. 10B, FIG. 10C and FIG. 10D illustrate various operations in a method of manufacturing a package structure 4 in accordance with some embodiments of the present disclosure.

Referring to FIG. 10A, in some embodiments, operations illustrated in FIGS. 9A-9C are performed, and these operations include, for example: providing a carrier 10A; forming a substrate 100 including a redistribution layer 110 on the carrier 10A; forming a passivation layer 2301 defining a recess 2301R on the substrate 100; forming a seed layer 250' on the passivation layer 2301 and in the recess 2301R defined by the passivation layer 2301; and forming a conductive layer 210 in the recess 2301R. Still referring to FIG. 10A, the patterned photoresist PR5 illustrated in FIG. 9C is removed, and a patterned photoresist PR7 is formed in the recess 2301R, a trench Tr1 defined by the photoresist PR7 and the lateral surface 211 of the conductive layer 210.

Referring to FIG. 10B, portions of the seed layer 250' on an upper surface of the passivation layer 2301 and exposed from the trench Tr1 are removed to form a seed layer 250 (also referred to as "a portion 251 of a seed layer 250") having an opening 250A. In some embodiments, a portion of the surface 101 of the substrate 100 is exposed from the opening 250A. In some embodiments, a portion of the redistribution layer 110 of the substrate 100 is exposed from the opening 250A. In some embodiments, a first wet etching process is performed to remove a portion of the sub-layer 2502 leaving the sub-layer 2501 remained substantially intact, and a second wet etching process is then performed to remove a portion of the sub-layer 2501. In some embodiments, the first etching process and the second etching process utilize different etchants to respectively etch away the sub-layer 2502 and the sub-layer 2501.

Figure 10C:
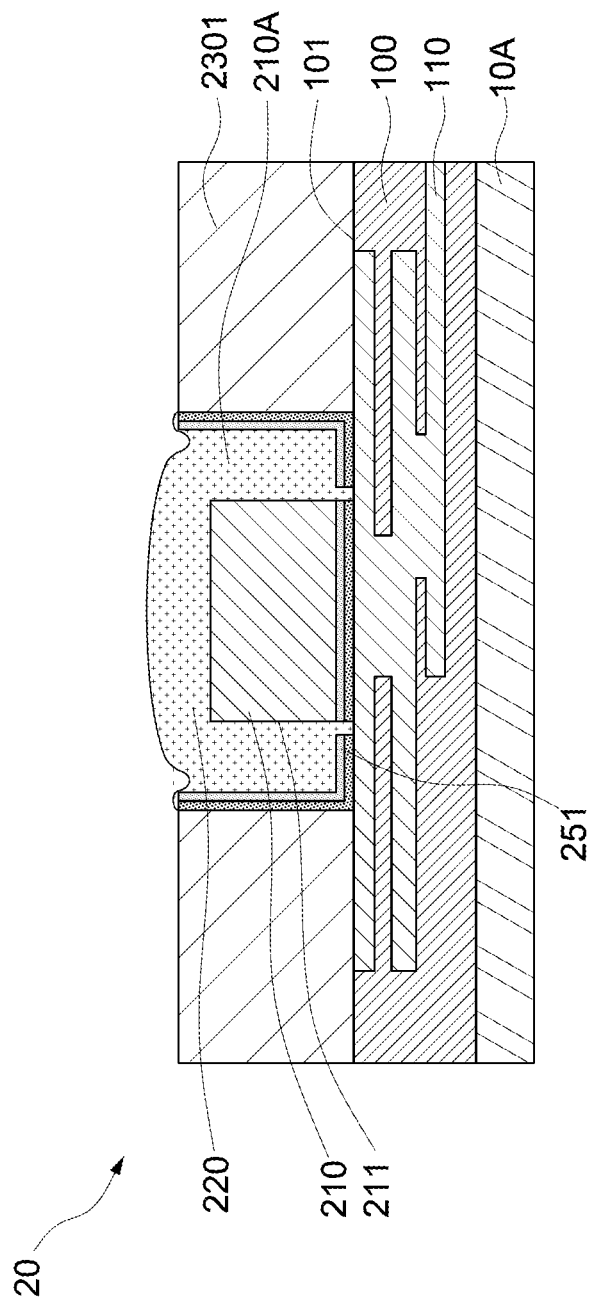

Referring to FIG. 10C, the patterned photoresist PR7 is removed, and a bonding layer 220 is formed on the lateral surface 211 and the upper surface 212 of the conductive layer 210 and passing through the opening 250A of the seed layer 250 (or the portion 251 of the seed layer 250). The patterned photoresist PR7 may be removed by stripping. In some embodiments, a conductive material may be formed on the lateral surface 211 and the upper surface 212 of the conductive layer 210 and in the opening 250A defined by the seed layer 250 (or the portion 251 of the seed layer 250) to form the bonding layer 220. In some embodiments, the bonding layer 220 may be formed by an electroless plating process. The lateral surface 211 of the conductive layer 210, the surface of the seed layer 250 (or the portion 251 of the seed layer 250), and the portion of the substrate 100 exposed from the opening 250A may serve as the formation area of the bonding layer 220 by electroless plating. In some embodiments, the bonding layer 220 may be protruded from the upper surface of the passivation layer 2301. As such, a bonding structure 20 is formed.

Figure 10D:
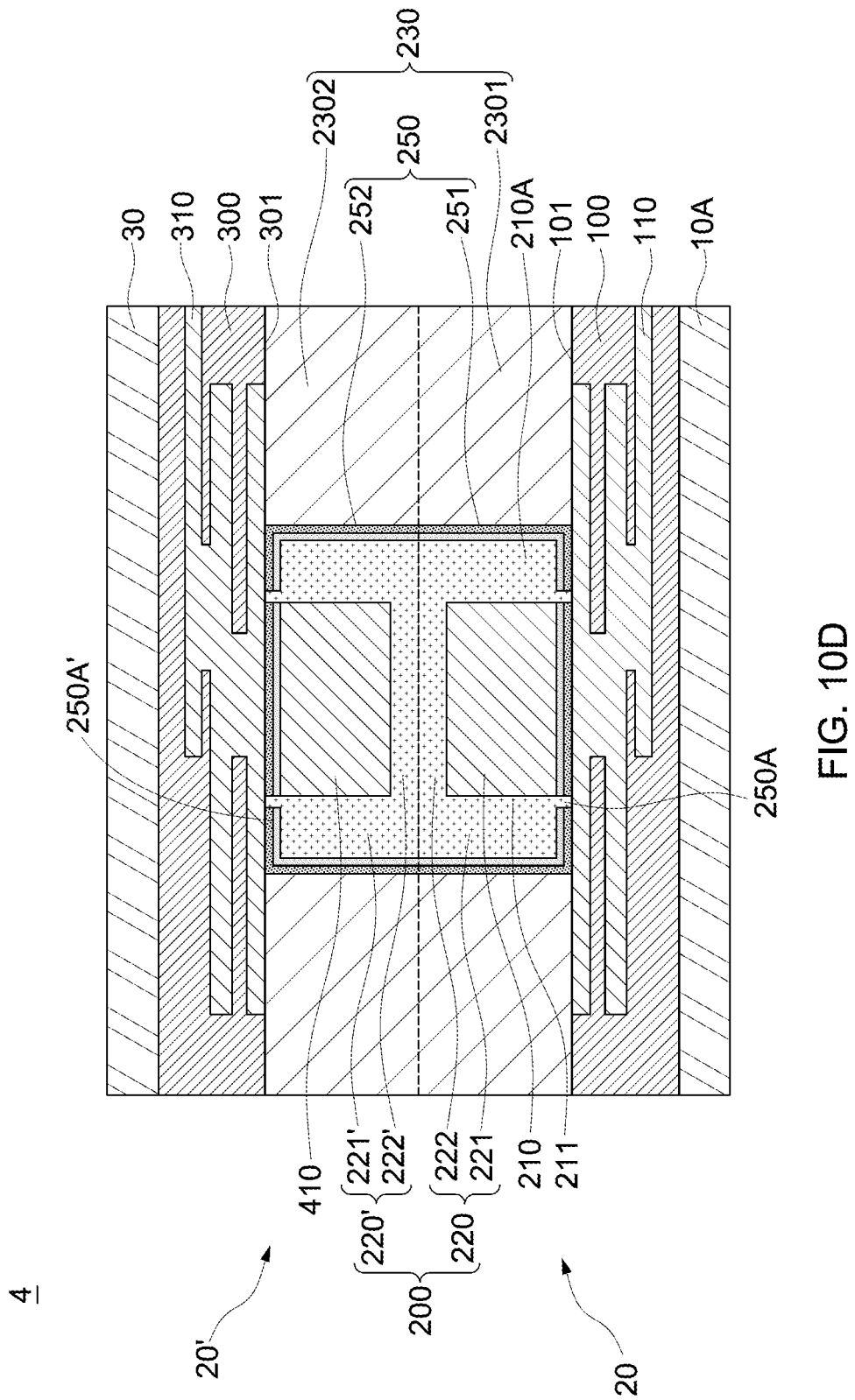

Referring to FIG. 10D, a bonding structure 20' is formed. In some embodiments, the bonding structure 20' may be formed by operations similar to those for forming the bonding structure 20 illustrated in FIGS. 10A-10C. In some embodiments, the lateral surface 411 of the conductive layer 410, the surface of the seed layer 250 (or the portion 252 of the seed layer 250), and a portion of the substrate 300 exposed from the opening 250A' may serve as the formation area of the bonding layer 220' by electroless plating. Still referring to FIG. 10D, the bonding layer 220 is bonded to the bonding layer 220'. In some embodiments, the portion 251 of the seed layer 250 is bonded to the portion 252 of the seed layer 250 when bonding the bonding layer 220 to the bonding layer 220'. As such, the package structure 4 is formed.

FIG. 11A, FIG. 11B, FIG. 11C, FIG. 11D and FIG. 11E illustrate various operations in a method of manufacturing a package structure 8 in accordance with some embodiments of the present disclosure.

Figure 11A:
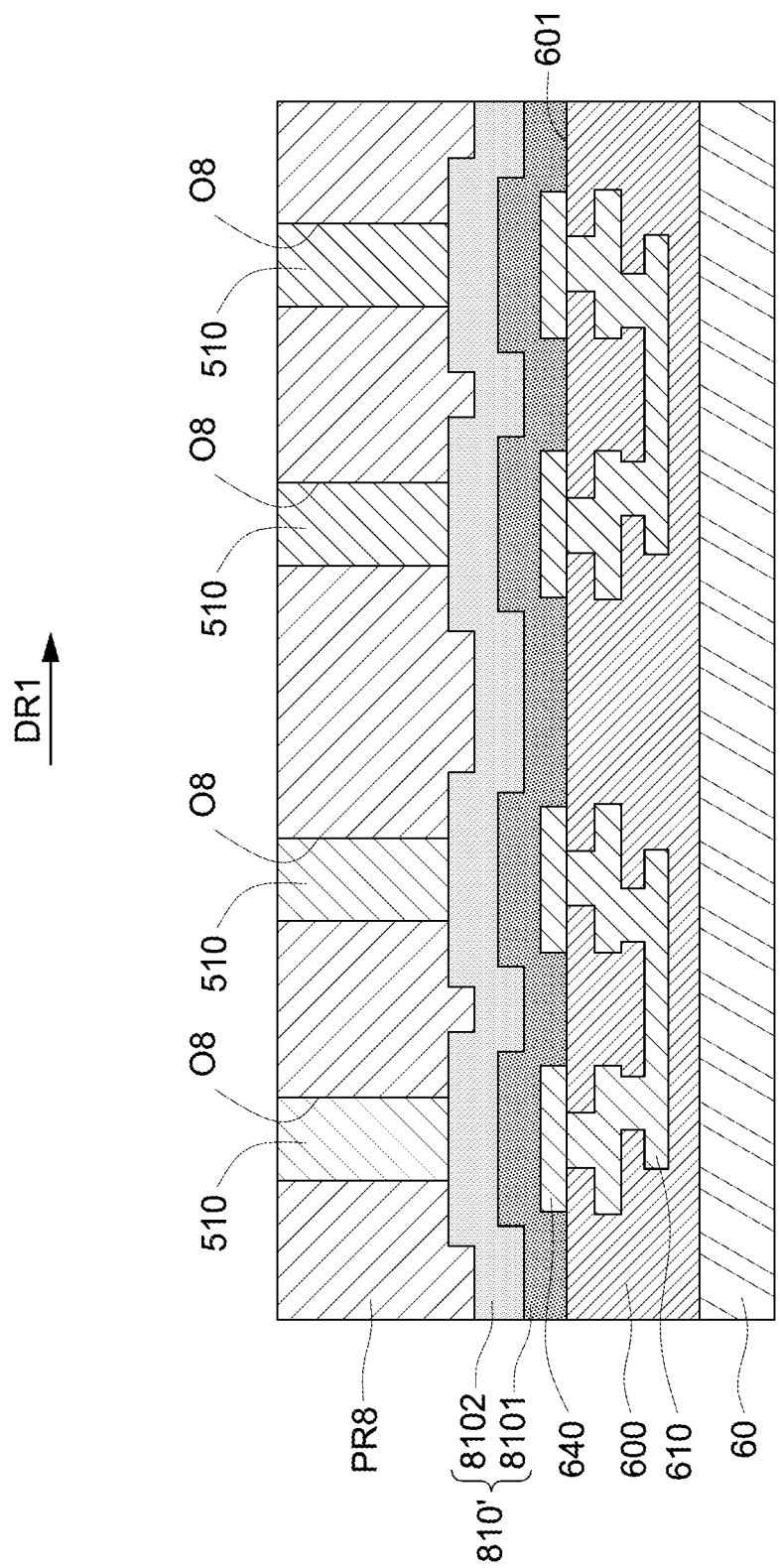
FIG. 11A, FIG. 11B, FIG. 11C, FIG. 11D and FIG. 11E illustrate various operations in a method of manufacturing a package structure in accordance with some embodiments of the present disclosure.

Referring to FIG. 11A, a carrier 60 is provided, a substrate 600 having a surface 601 (also referred to as "an upper surface") and including a redistribution layer 610 is formed on the carrier 60, and one or more conductive pillars 510 are formed on the surface 601 of the substrate 600. In some embodiments, one or more conductive pads 640 may be formed on the surface 601 of the substrate 600 to electrically connect to the redistribution layer 610 of the substrate 600. In some embodiments, a seed layer 810' may be optionally formed on the conductive pads 640 and the surface 601 of the substrate 600, and then the conductive pillars 510 may be formed on the seed layer 810'. In some embodiments, the seed layer 810' includes a sub-layer 8101 formed on the surface 601 of the substrate 600 and a sub-layer 8102 formed on the sub-layer 8101. In some embodiments, the sub-layer 8101 is a Ti layer, and the sub-layer 8102 is a Cu layer. A material of the seed layer 810' is similar to that of the seed layer 250 as aforementioned and the description thereof is omitted hereinafter. In some embodiments, a patterned photoresist PR8 defining one or more openings O8 is formed on the seed layer 810', and a conductive material is filled in the openings O8 to form the one or more conductive pillars 510.

Figure 11B:
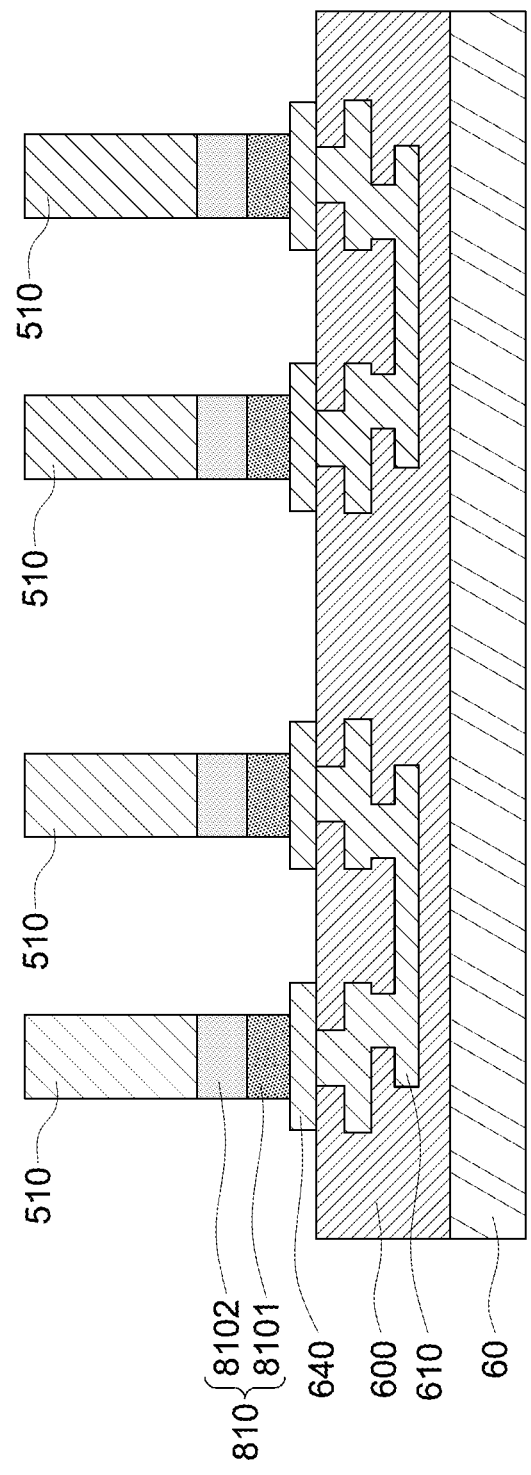

Referring to FIG. 11B, the patterned photoresist PR8 is removed. In some embodiments, a portion of the seed layer 810' under the patterned photoresist PR8 is removed. The patterned photoresist PR8 and the portion of the seed layer 810' may be removed by striping and wet etching.

Figure 11C:
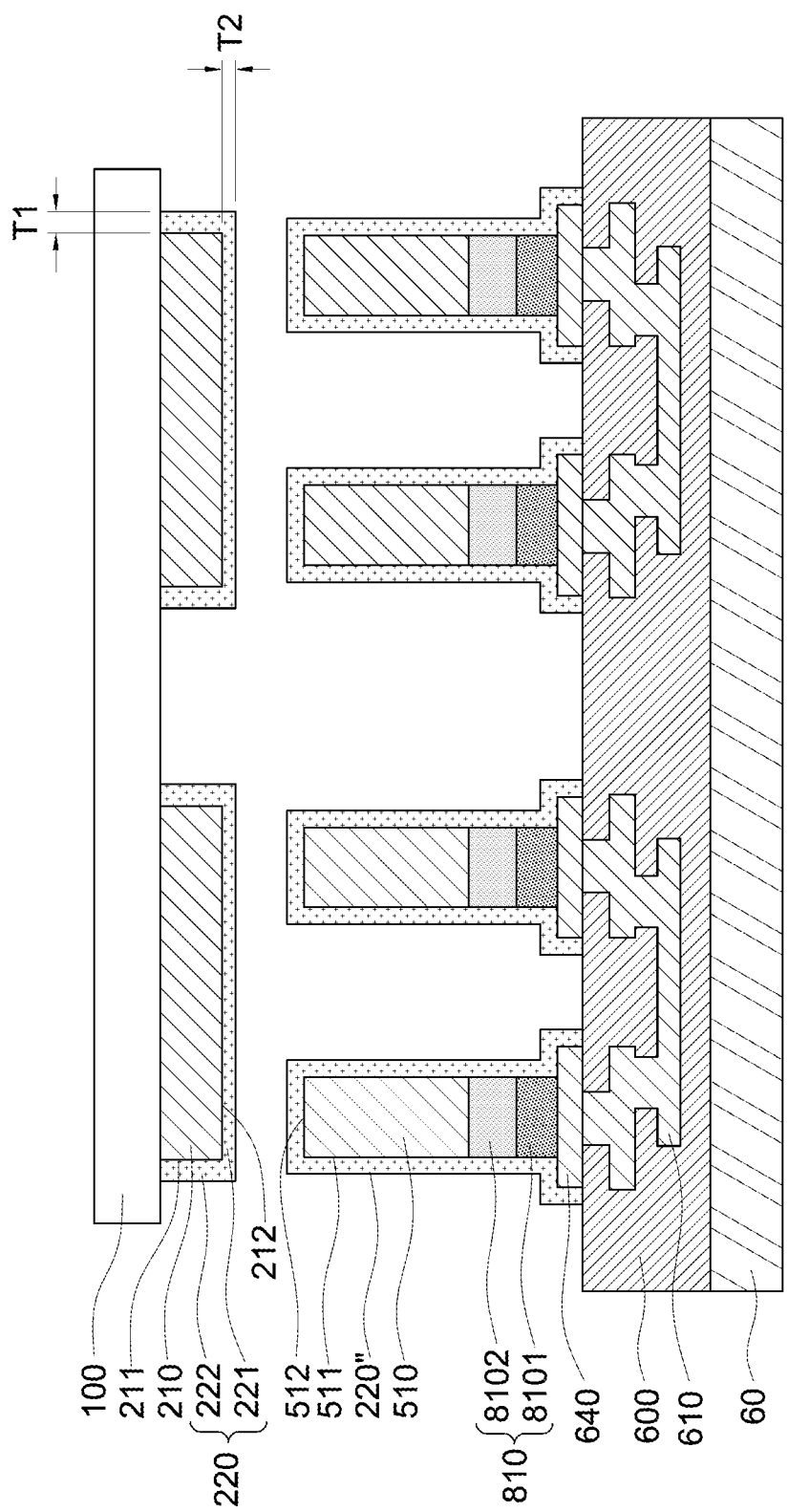

Referring to FIG. 11C, a bonding layer 220" is formed on the conductive pillars 510. In some embodiments, the bonding layer 220" is formed on upper surfaces 512 of the conductive pillars 510. In some embodiments, the bonding layer 220" is formed on lateral surfaces 511 of the conductive pillars 510 and the exposed portions of the conductive pads 640. In some embodiments, the bonding layers 220" may be formed by an electroless plating process.

Still referring to FIG. 11C, a substrate 100 is provided, one or more conductive layers 210 are formed on the substrate 100, and one or more bonding layers 220 are formed on lateral surfaces 211 and upper surfaces 212 of the conductive layers 210. In some embodiments, the operations for forming the conductive layers 210 and the bonding layers 220 in FIG. 11C are similar to those for forming the conductive layer 210 and the bonding layer 220 illustrated in FIGS. 8C-8G, except that the formation of the conductive pad 240 is omitted. For example, the structure including the substrate 100, the conductive layers 210 and bonding layers 220 in FIG. 11C may be formed by the following operations: forming a passivation layer and the conductive layers 210 on the substrate 100, the passivation layer and the lateral surfaces 211 of the conductive layers 210 defining trenches; forming the bonding layers 220 on the upper surfaces 212 of the conductive layers 210 and in the trenches; and removing the passivation layer. In some embodiments, the bonding layers 220 may be formed by an electroless plating process. In some embodiments, each of the bonding layers 220 includes a portion 222 on the upper surface 212 and a portion 221 on the lateral surface 211 of each of the conductive layers 210. In some embodiments, a ratio T1/T2 of the thickness T1 of the portion 221 to the thickness T2 of the portion 222 is equal to or greater than about 1. In some embodiments, the ratio T1/T2 of the thickness T1 to the thickness T2 is equal to or greater than about 2. In some embodiments, the ratio T1/T2 of the thickness T1 to the thickness T2 is equal to or greater than about 2.2.

Figure 11D:
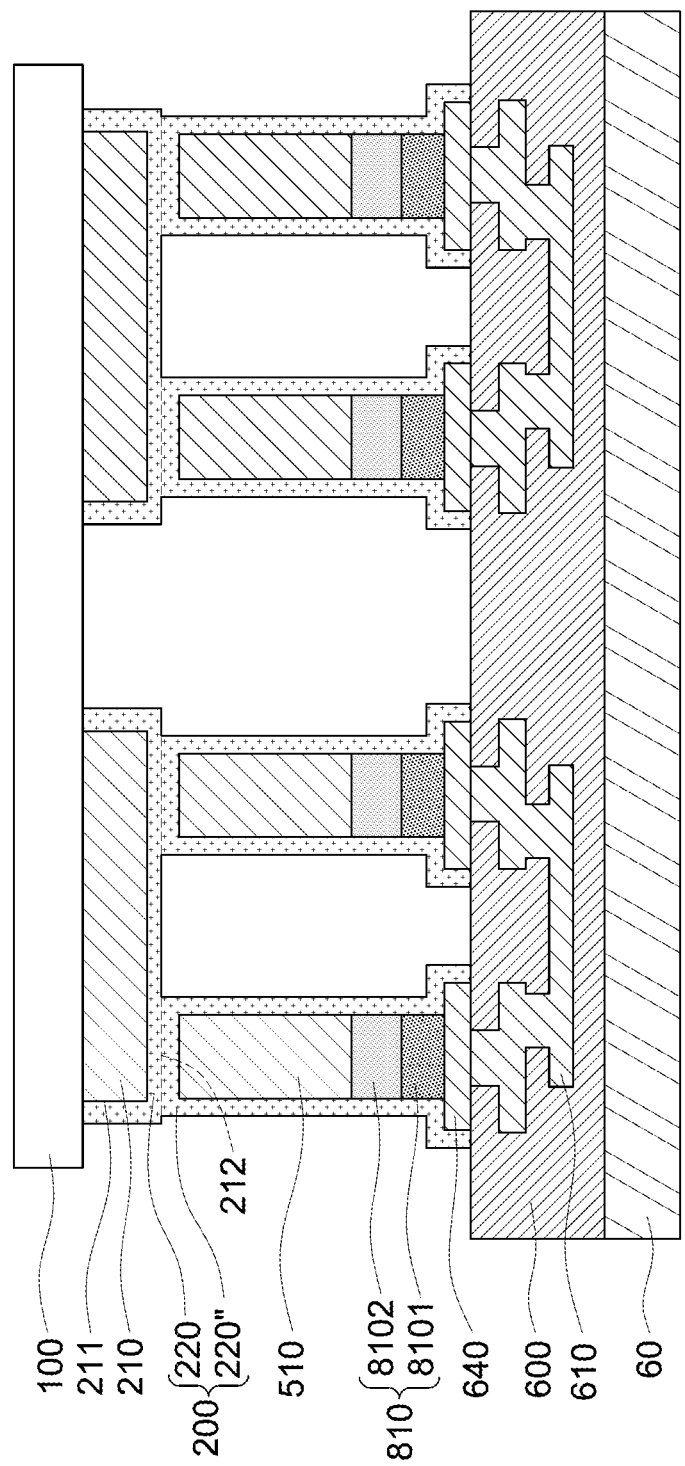

Referring to FIG. 11D, the bonding layer 220 is bonded to the bonding layer 220".

Figure 11E:
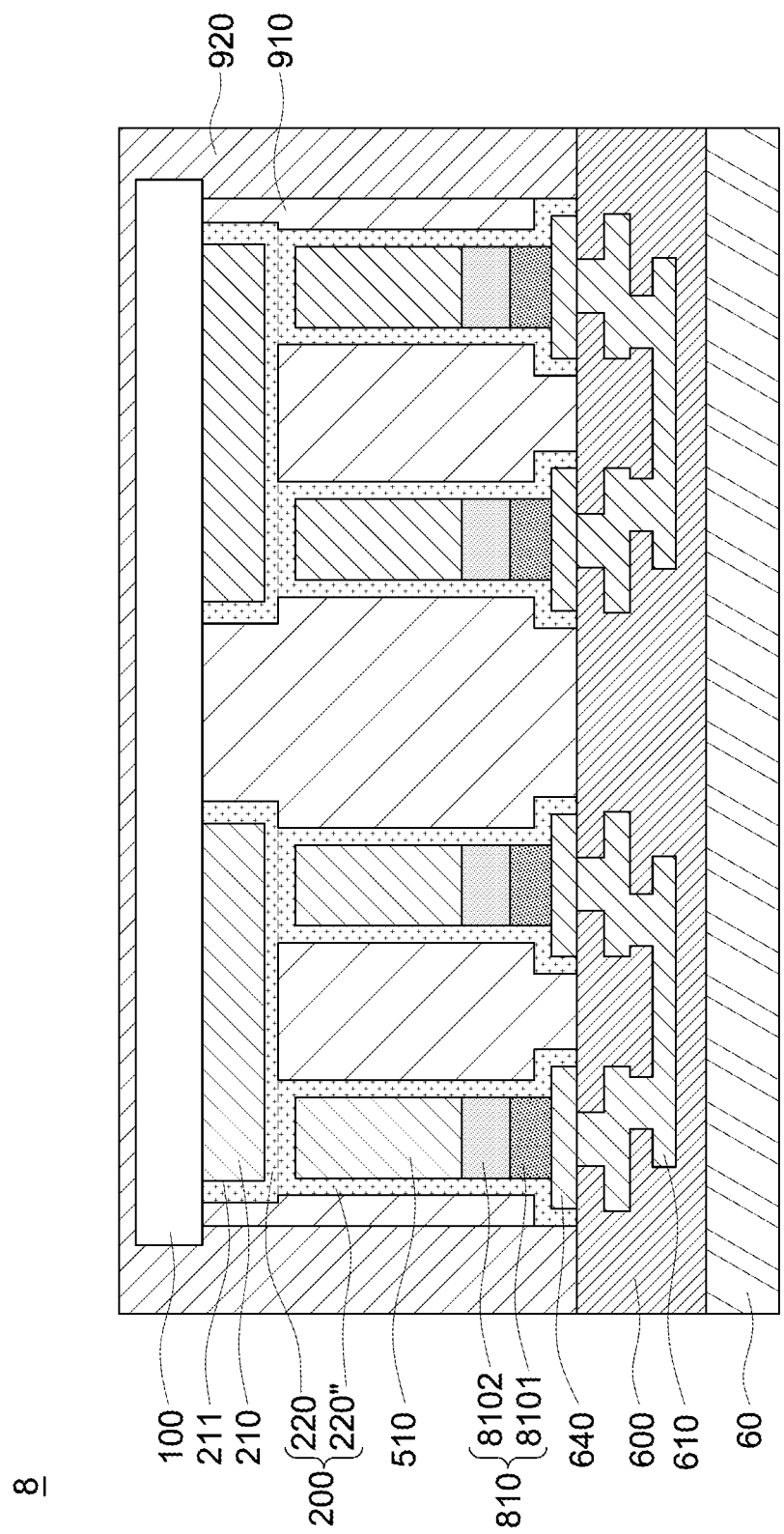

Referring to FIG. 11E, an underfill 910 is formed between the substrate 100 and the substrate 600 and filled between the conductive pillars 510, and an encapsulant 920 is formed to encapsulate the underfill 910 and the substrate 100. In some embodiments, the underfill 910 may include an epoxy resin, a molding compound (e.g., an epoxy molding compound or other molding compound), polyimide, a phenolic compound or material, a material including a silicone dispersed therein, or a combination thereof. In some embodiments, the encapsulant 920 may include an epoxy resin having fillers, a molding compound (e.g., an epoxy molding compound or other molding compound), polyimide, a phenolic compound or material, a material including a silicone dispersed therein, or a combination thereof. As such, a package structure 8 is formed.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of said numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 µm, no greater than 2 µm, no greater than 1 µm, or no greater than 0.5 µm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and the like. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A package structure, comprising:
   a first substrate;
   a first passivation layer disposed on the first substrate, the first passivation layer having an upper surface, wherein the first passivation layer and the first substrate define a first cavity;
   a first conductive layer disposed in the first cavity and having an upper surface, wherein a portion of the upper surface of the first conductive layer is below an upper surface of the first passivation layer; and
   a first conductive bonding structure disposed on the first conductive layer,
   wherein a first accommodating space is defined by a lateral surface of the first conductive layer and an inner lateral surface of the first passivation layer, and the first conductive bonding structure is in the first accommodating space.

2. The package structure as claimed in claim 1, wherein the first conductive bonding structure covers the portion of the upper surface of the first conductive layer.

3. The package structure as claimed in claim 1, further comprising:
   a second substrate on the first substrate;
   a second passivation layer disposed on the second substrate, wherein the second passivation layer and the second substrate define a second cavity, and a lower surface of the second passivation layer is bonded to the upper surface of the first passivation layer to form a bonding interface; and
   a second conductive layer disposed in the second cavity and electrically connected to the first bonding layer.

4. The package structure as claimed in claim 3, wherein the second conductive layer has a lower surface facing the first substrate, and a portion of the lower surface of the second conductive layer is below the bonding interface.

5. The package structure as claimed in claim 4, further comprising:
   a second conductive bonding structure disposed on the second conductive layer and bonded to the first conductive bonding structure.

6. The package structure as claimed in claim 5, wherein a second accommodating space is defined by a lateral surface of the second conductive layer and an inner lateral surface of the second passivation layer, and the second conductive bonding structure is in the second accommodating space.

7. The package structure as claimed in claim 6, wherein a width of the first accommodating space or a width of the second accommodating space is less than a distance between the upper surface of the first conductive layer and the lower surface of the second conductive layer.

8. The package structure as claimed in claim 6, further comprising:
   a seed layer on at least one of the inner lateral surface of the first passivation layer and the inner lateral surface of the second passivation layer.

9. The package structure as claimed in claim 8, wherein a distance between the seed layer and the lateral surface of the first conductive layer or a distance between the seed layer and the lateral surface of the second conductive layer is greater than a distance between the upper surface of the first conductive layer and the lower surface of the second conductive layer.

10. The package structure as claimed in claim 5, wherein a material of the first conductive layer or a material of the second conductive layer is different from a material of the first or second conductive bonding structure.

11. The package structure as claimed in claim 3, wherein a melting point of the first or second conductive bonding structure is lower than a melting point of the first conductive layer and a melting point of the second conductive layer.

12. The package structure as claimed in claim 3, wherein a hardness of the first or second conductive bonding structure is lower than a hardness of the first conductive layer and a hardness of the second conductive layer.

13. The package structure as claimed in claim 8, wherein the first conductive bonding structure is spaced apart from the first passivation layer by the seed layer.

14. The package structure as claimed in claim 8, wherein the seed layer surrounds the first conductive bonding structure on the lateral surface of the first conductive layer.

15. A bonding structure, comprising:
    a first substrate having a first surface;
    a passivation layer disposed on the first surface of the first substrate, wherein the passivation layer and the substrate define a cavity;
    a first conductive layer disposed in the cavity, wherein the first conductive layer has an upper surface, and a portion of the upper surface is at an elevation lower than that of an upper surface of the passivation layer; and
    a bonding layer formed on the upper surface of the first conductive layer,
    wherein the passivation layer and a lateral surface of the first conductive layer define a trench for accommodating a portion of the bonding layer.

16. The bonding structure as claimed in claim 15, wherein an upper surface of the bonding layer is coplanar with or protruded from the upper surface of the passivation layer.

* * * * *